United States Patent
Kim

(10) Patent No.: US 10,453,542 B2
(45) Date of Patent: Oct. 22, 2019

(54) MEMORY DEVICE AND METHOD OF OPERATING THE SAME

(71) Applicant: SK hynix Inc., Icheon-si, Gyeonggi-do (KR)

(72) Inventor: Hae Soo Kim, Cheongju-si Chungcheongbuk-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/977,410

(22) Filed: May 11, 2018

(65) Prior Publication Data

US 2019/0035481 A1    Jan. 31, 2019

(30) Foreign Application Priority Data

Jul. 26, 2017   (KR) .................. 10-2017-0094852

(51) Int. Cl.
  *G11C 16/06*   (2006.01)
  *G11C 16/34*   (2006.01)
  *G11C 16/04*   (2006.01)
  *G11C 16/16*   (2006.01)
  *G11C 16/10*   (2006.01)

(52) U.S. Cl.
  CPC ...... *G11C 16/3445* (2013.01); *G11C 16/0483* (2013.01); *G11C 16/10* (2013.01); *G11C 16/16* (2013.01); *G11C 16/3404* (2013.01); *G11C 16/3409* (2013.01)

(58) Field of Classification Search
  CPC . G11C 16/10; G11C 11/5628; G11C 16/0483; G11C 16/20; G11C 16/3454; G11C 16/3459; G11C 2211/5621; G11C 2211/5642; G11C 2211/5644; G11C 2216/14; G11C 16/16

USPC ............. 365/185.19, 185.22, 226, 49.1
  See application file for complete search history.

(56) References Cited

U.S. PATENT DOCUMENTS

6,462,990 B1 *  10/2002  Keeney ............. G11C 16/3404
                                                        365/185.22
2010/0302860 A1 * 12/2010  Oh ................... G11C 11/5628
                                                        365/185.19

FOREIGN PATENT DOCUMENTS

KR    1020110119328 A    11/2011
KR    1020160046954 A    5/2016

OTHER PUBLICATIONS

Ryota Fujitsuka et al., "Engineering of Si-Rich Nitride Charge-Trapping Layer for Highly Reliable Metal-Oxide-Nitride-Oxide-Semiconductor Type NAND Flash Memory with Multi-Level Cell Operation", Feb. 8, 2012, Japanese Journal of Applied Physics 51.
S. Habermehl et al., "Correlation of charge transport to local atomic strain in Si-rich silicon nitride thin films", Applied Physics Letters, Jan. 14, 2002, pp. 261-263, vol. 80, No. 2, American Institute of Physics.

* cited by examiner

*Primary Examiner* — Thong Q Le
(74) *Attorney, Agent, or Firm* — William Park & Associates Ltd.

(57) ABSTRACT

Provided herein may be a method of operating a memory device. The method may include applying an erase voltage to a memory block. The method may include performing an erase verify operation on the memory block. The method may include performing a first blind program operation based on a result of the erase verify operation.

21 Claims, 19 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0094852 filed on Jul. 26, 2017 in the Korean Intellectual Property Office, the entire disclosure of which is incorporated herein by reference.

BACKGROUND

1. Technical Field

Various embodiments of the present disclosure generally relate to a memory device and a method of operating the memory device, and more particularly, to a memory device configured to perform a blind program operation.

2. Related Art

Semiconductor memory devices may be chiefly classified into a volatile semiconductor memory device and a non-volatile semiconductor memory device. A volatile semiconductor memory device is advantageous in that reading and writing may be performed at high speed, but is disadvantageous in that stored information is lost when the supply of power is interrupted. In contrast, a nonvolatile semiconductor memory device may retain information stored therein even if the supply of power is interrupted. Therefore, the nonvolatile semiconductor memory device is used to store information to be retained regardless of whether power is supplied.

Examples of the nonvolatile semiconductor memory device may include a mask read-only memory (MROM), a programmable read-only memory (PROM), an erasable programmable read-only memory (EPROM), an electrically erasable programmable read-only memory (EEPROM), etc.

A representative example of the nonvolatile semiconductor memory device may include a flash memory device. A flash memory device has been widely used as an audio and video data storage medium for electronic devices, such as a computer, a mobile phone, a personal digital assistant (PDA), a digital camera, a camcorder, a voice recorder, an MP3 player, a handheld personal computer (PC), a game console, a facsimile, a scanner, and a printer.

Recently, as a demand for high integration of memory devices has increased, multi-bit flash memory devices in which multiple bits are stored in a single memory cell have been popularized.

A memory device may include a plurality of memory cells coupled to each word line and perform a program operation of storing data in the memory cells and an erase operation of erasing the programmed data.

SUMMARY

An embodiment of the present disclosure may provide for a method of operating a memory device. The method may include applying an erase voltage to a memory block. The method may include performing an erase verify operation on the memory block. The method may include performing a first blind program operation based on a result of the erase verify operation.

An embodiment of the present disclosure may provide for a method of operating a memory device. The method may include performing a first blind program operation on a memory block. The method may include applying an erase voltage to the memory block. The method may include performing an erase verify operation on the memory block. The method may include performing a second blind program operation on the memory block when a result of the erase verify operation indicates failure.

An embodiment of the present disclosure may provide for a method of operating a memory device. The method may include applying an erase voltage to a memory block. The method may include performing an erase verify operation on the memory block. The method may include performing either a first blind program operation or a second blind program operation on the memory block based on a result of the erase verify operation.

An embodiment of the present disclosure may provide for a method of operating a memory device. The method may include applying an erase voltage to a memory block. The method may include performing an erase verify operation on the memory block. The method may include performing a first blind program operation according to an erase count value of the memory block, based on a result of the erase verify operation.

DETAILED DESCRIPTION

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component. Furthermore, unless defined otherwise, "include/comprise" or "including/comprising" used in the specification represents that one or more components, steps, operations, and elements exist or are added.

Various embodiments of the present disclosure may be directed to a memory device having improved reliability, and a method of the memory device.

Figure 1:
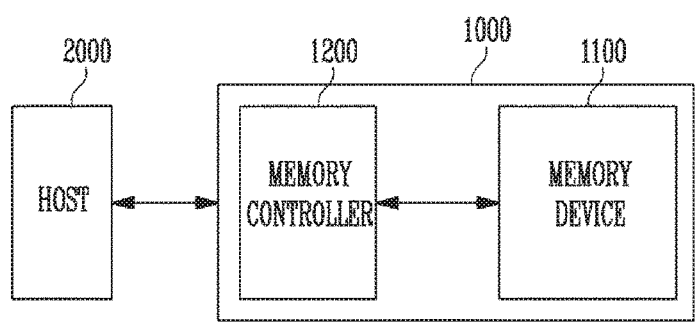
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a memory device 1100 configured to store data, and a memory controller 1200 configured to control the memory device 1100 under control of a host 2000.

The host 2000 may communicate with the memory system 1000 using an interface protocol such as a peripheral component interconnect-express (PCI-E), an advanced technology attachment (ATA), a serial ATA (SATA), a parallel ATA (PATA) or a serial attached SCSI (SAS). In addition, the interface protocol provided for the purpose of data communication between the host 2000 and the memory system 1000 is not limited to the foregoing examples, and it may be any one of interface protocols such as a universal serial bus (USB), a multi-media card (MMC), an enhanced small disk interface (ESDI), or integrated drive electronics (IDE).

The memory controller 1200 may control the overall operation of the memory system 1000 and data exchange between the host 2000 and the memory device 1100. For instance, the memory controller 1200 may control the memory device 1100 to program or read data in response to a request of the host 2000. Furthermore, the memory controller 1200 may control the memory device 1100 such that information is stored in main memory blocks and sub-memory blocks included in the memory device 1100, and a program operation is performed on the main memory blocks or the sub-memory blocks depending on the amount of data loaded for the program operation. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM) or a flash memory.

The memory device 1100 may perform a program, read, or erase operation under control of the memory controller 1200.

Figure 2:
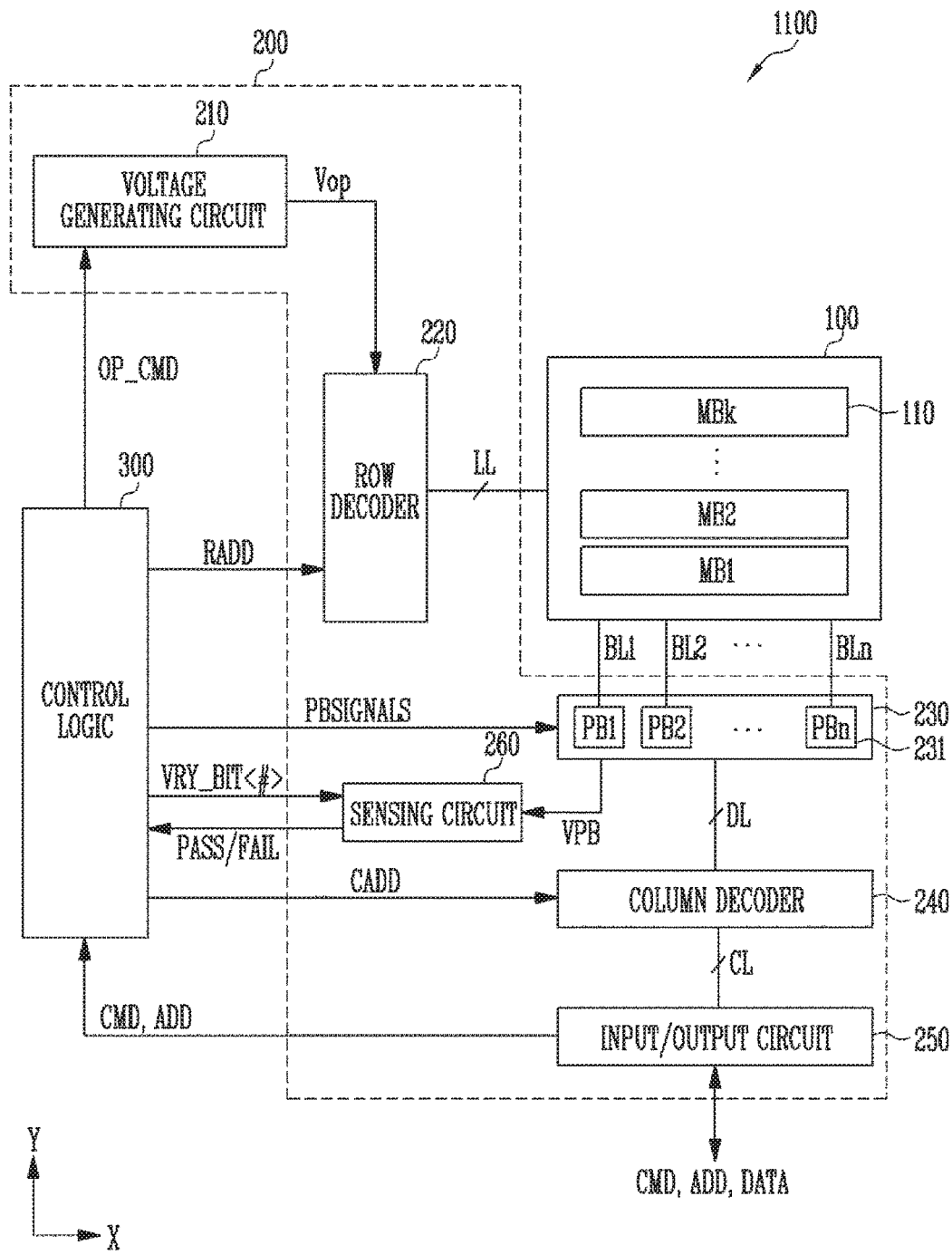
FIG. 2 is a diagram illustrating a memory device of FIG. 1.

FIG. 2 is a diagram illustrating the memory device 1100 of FIG. 1.

Referring to FIG. 2, the memory device 1100 may include a memory cell array 100 configured to store data. The memory device 1100 may include peripheral circuits 200 configured to perform a program operation for storing data in the memory cell array 100, a read operation for outputting the stored data, and an erase operation for erasing the stored data. The memory device 1100 may include a control logic 300 configured to control the peripheral circuits 200 under control of the memory controller (1200 of FIG. 1).

The memory cell array 100 may include a plurality of memory blocks MB1 to MBk (110; k is a positive integer). Local lines LL and bit lines BL1 to BLn (n is a positive integer) may be coupled to each of the memory blocks MB1 to MBk (110). For example, the local lines LL may include a first select line, a second select line, and a plurality of word lines arranged between the first and second select lines. Furthermore, the local lines LL may include dummy lines arranged between the first select line and the word lines and between the second select line and the word lines. Here, the first select line may be a source select line, and the second select line may be a drain select line. For example, the local lines LL may include word lines, drain select lines, source select lines, and source lines (SL). For example, the local lines LL may further include dummy lines. For example, the local lines LL may further include pipelines. The local lines LL may be coupled to each of the memory blocks MB1 to MBk (110). The bit lines BL1 to BLn may be coupled in common to the memory blocks MB1 to MBk (110). The memory blocks MB1 to MBk (110) may be embodied in a two- or three-dimensional structure. For example, in the memory blocks 110 having a two-dimensional structure, the memory cells may be arranged in a direction parallel to a substrate. For example, in the memory blocks 110 having a three-dimensional structure, the memory cells may be stacked in a direction perpendicular to the substrate.

The peripheral circuits 200 may be configured to perform program, read and erase operations on a selected memory block 110 under control of the control logic 300. For example, under control of the control logic 300, the peripheral circuits 200 may supply a verify voltage and pass voltages to the first select line, the second select line, and the word lines, may selectively discharge the first select line, the second select line, and the word lines, and may verify memory cells coupled to a selected word line among the word lines. For instance, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop to be used for the program, read, and erase operations in response to an operating signal OP_CMD. Furthermore, the voltage generating circuit 210 may selectively discharge the local lines LL in response to the operating signal OP_CMD. For example, the voltage generating circuit 210 may generate a program voltage, a verify voltage, pass voltages, a turn-on voltage, a read voltage, an erase voltage, a source line voltage, etc. under control of the control logic 300.

The row decoder 220 may deliver operating voltages Vop to local lines LL coupled to a selected memory block 110 in response to a row address RADD.

The page buffer group 230 may include a plurality of page buffers PB1 to PBn (231) coupled to the bit lines BL1 to BLn. The page buffers PB1 to PBn (231) may operate in response to page buffer control signals PBSIGNALS. For instance, the page buffers PB1 to PBn (231) may temporarily store data received through the bit lines BL1 to BLn or sense voltages or currents of the bit lines BL1 to BLn during a read or verify operation.

The column decoder 240 may transmit data between the input/output circuit 250 and the page buffer group 230 in response to a column address CADD. For example, the column decoder 240 may exchange data with the page buffers 231 through data lines DL or exchange data with the input/output circuit 250 through column lines CL.

The input/output circuit 250 may transmit a command CMD or an address ADD received from the memory controller (1200 of FIG. 1) to the control logic 300, or exchange data DATA with the column decoder 240.

During the read or verify operation, the sensing circuit 260 may generate a reference current in response to an enable bit VRY_BIT<#>, and may compare a sensing voltage VPB received from the page buffer group 230 with a reference voltage generated by the reference current and output a pass signal PASS or a fail signal FAIL.

The control logic 300 may output an operating signal OP_CMD, a row address RADD, page buffer control signals PBSIGNALS, and an enable bit VRY_BIT<#> in response to a command CMD and an address ADD and thus control the peripheral circuits 200. In addition, the control logic 300 may determine whether a verify operation has passed or failed in response to a pass or fail signal PASS or FAIL.

Figure 3:
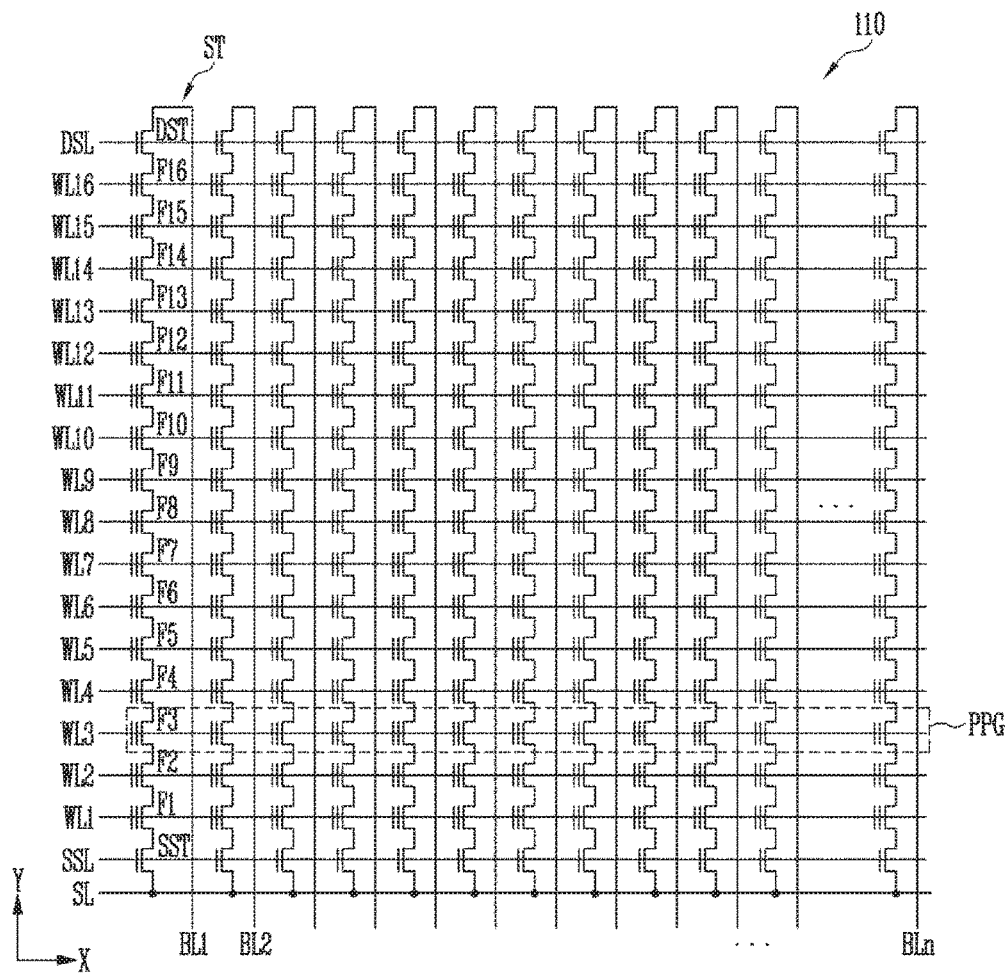
FIG. 3 is a diagram illustrating a memory block of FIG. 2.

FIG. 3 is a diagram illustrating a memory block 110 of FIG. 2.

Referring to FIG. 3, in the memory block 110, a plurality of word lines arranged parallel to each other may be coupled between a first select line and a second select line. Here, the first select line may be a source select line SSL, and the second select line may be a drain select line DSL. For example, the memory block 110 may include a plurality of strings ST coupled between the bit lines BL1 to BLn and the source line SL. The bit lines BL1 to BLn may be respectively coupled to the strings ST, and the source line SL may be coupled in common to the strings ST. The strings ST may have the same configuration; therefore, only the string ST that is coupled to the first bit line BL1 will be described below as an example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 illustrated in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to the same word line may be referred to as a physical page PPG. Therefore, the number of physical pages PPG included in the memory block 110 may correspond to the number of word lines WL1 to WL16.

Each memory cell MC may store 1-bit data. This memory cell is typically called a single level cell SLC. In this case, each physical page PPG may store data of a single logical page LPG. Data of each logical page LPG may include data bits corresponding to the number of cells included in a single physical page PPG. Each memory cell MC may store 2- or more-bit data. This memory cell is typically called a multi-level cell MLC. In this case, each physical page PPG may store data of two or more logical pages LPG.

Figure 4:
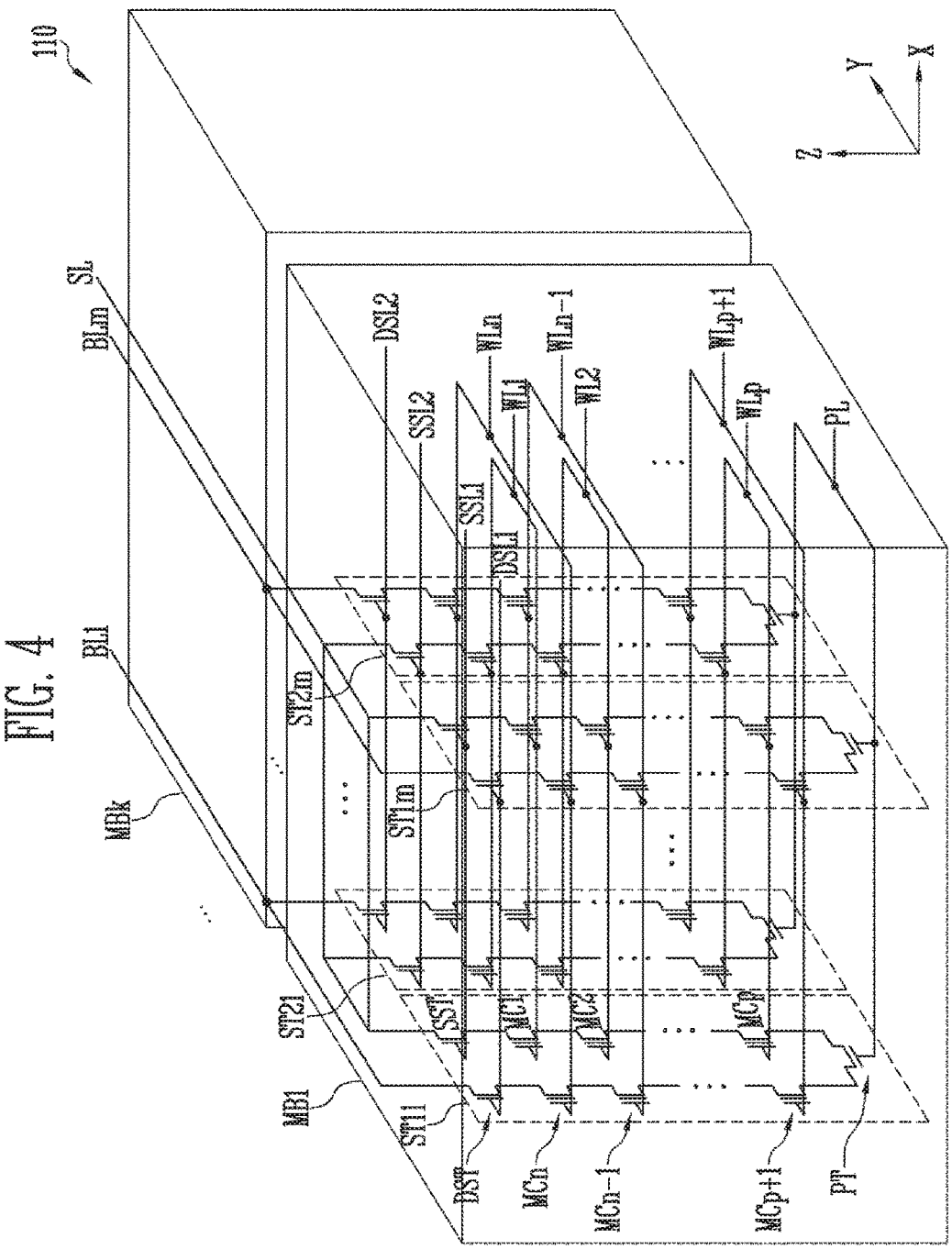
FIG. 4 is a diagram illustrating memory blocks having a three-dimensional structure in accordance with an embodiment of the present disclosure.

FIG. 4 is a diagram illustrating memory blocks MB1 to MBk (110) having a three-dimensional structure in accordance with an embodiment of the present disclosure.

Referring to FIG. 4, the memory cell array 100 may include a plurality of memory blocks MB1 to MBk (110). Each memory block 110 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (i.e. in an X direction). In FIG. 4, there has been illustrated an example in which two strings are arranged in a column direction (i.e., in a Y direction), this is only for the sake of explanation. For example, three or more strings may be arranged in the column direction (the Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have structures similar to each other. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. In an embodiment, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCp.

In an embodiment, source select transistors of strings arranged in the same row may be coupled to a source select line extending in the row direction. Source select transistors of strings arranged in different rows may be coupled to different source select lines. In FIG. 4, the source select transistors of the strings ST11 to ST1m in a first row may be coupled to a first source select line SSL1. The source select transistors of the strings ST21 to ST2m in a second row may be coupled to a second source select line SSL2.

In an embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The p+1-th to n-th memory cells MCCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. The gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 4, the strings ST11 and ST21 in a first column may be coupled to a first bit line BL1. The strings ST1m and ST2m in an m-th column may be coupled to an m-th bit line BLm.

Among the strings arranged in the column direction, memory cells coupled to the same word line may form one page. For example, memory cells coupled to the first word line WL1, among the strings ST11 to ST1m in the first row, may form a single page. Memory cells coupled to the first word line WL1, among the strings ST21 to ST2m in the second row, may form another single page. When any one of the drain select lines DSL1 and DSL2 is selected, strings arranged in a corresponding row may be selected. When any one of the word lines WL1 to WLn is selected, a corresponding page of the selected strings may be selected.

Figure 5:
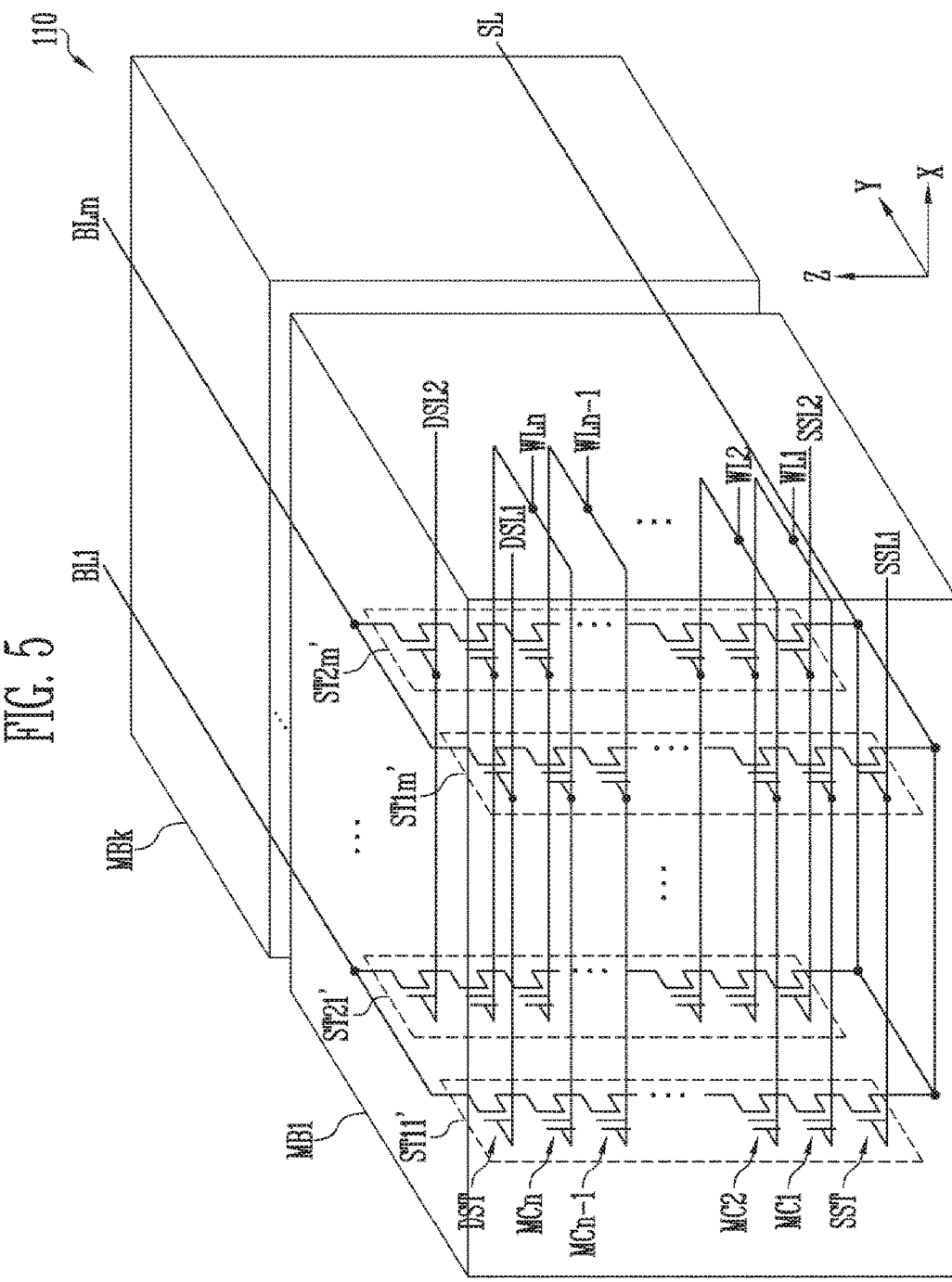
FIG. 5 is a diagram illustrating memory blocks having a three-dimensional structure in accordance with an embodiment of the present disclosure.

FIG. 5 is a diagram illustrating memory blocks MB1 to MBk (110) having a three-dimensional structure in accordance with an embodiment of the present disclosure.

Referring to FIG. 5, the memory cell array 100 may include a plurality of memory blocks MB1 to MBk (110). Each memory block 110 may include a plurality of strings ST11' to ST1m' and ST21' to ST2m'. Each of the strings ST11' to ST1m' and ST21' to ST2m' may extend in a vertical direction (i.e., in a Z direction). In each memory block 110, m strings may be arranged in a row direction (i.e., in an X direction). In FIG. 5, there has been illustrated an example in which two strings are arranged in a column direction (i.e., in a Y direction), this is only for the sake of explanation. For example, three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or current of the corresponding string may be stably controlled. Thereby, the reliability of data stored in each memory block 110 may be improved.

The drain select transistor DST of each string may be coupled between the corresponding bit line and the memory cells MC1 to MCn. Drain select transistors DST of strings arranged in the row direction may be coupled to corresponding drain select lines. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

In other words, the memory block 110 of FIG. 5 may have an equivalent circuit similar to that of the memory block 110 of FIG. 4 except that a pipe transistor PT is excluded from each cell string.

Figure 6:
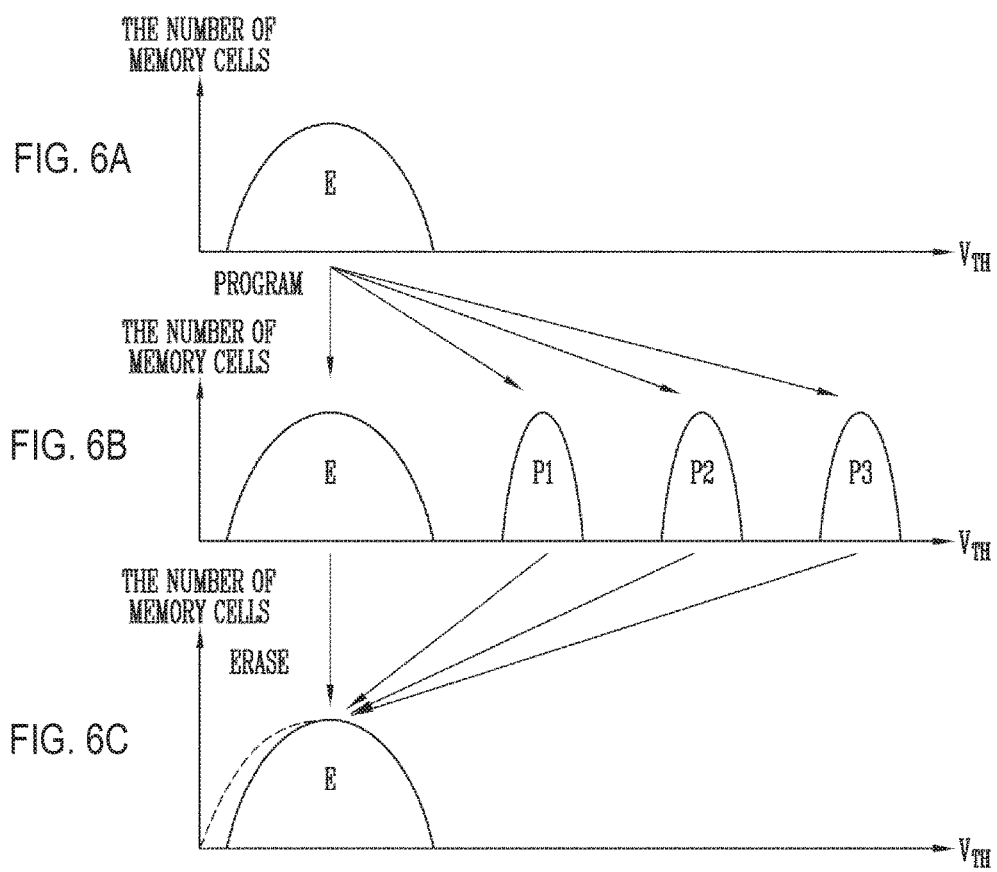
FIGS. 6A to 6C are diagrams used for illustrating program and erase operations.

FIGS. 6A to 6C are diagrams used for illustrating program and erase operations.

FIGS. 6A to 6C illustrate a threshold voltage distribution of memory cells coupled to a single word line, that is, memory cells included in a single physical page PPG. When the physical page PPG is in a clean page state in which no data is stored therein, each of the memory cells included in the physical page PPG may have a threshold voltage of an erase state, as illustrated in FIG. 6A. The threshold voltage of the memory cell that is in the erase state may be a negative threshold voltage or a positive value around 0V. If program data is inputted to the memory device 1100 and a program operation is performed on the physical page PPG, each of the memory cells may have a threshold voltage corresponding to a single erase state or any one of two or more program states. FIG. 6B illustrates a threshold voltage distribution of the memory cells in the case where each memory cell may store 2-bit data. The program operation may be performed by injecting electrons into a floating gate or a charge trap layer of each memory cell.

Data stored in the memory cell may be erased through an erase operation. The erase operation may be performed by removing the electrons from the floating gate or the charge trap layer of the memory cell. The threshold voltage of the memory cell may be reduced through the erase operation. The erase operation may be performed on a memory block (110) basis. In other words, the erase operation may be simultaneously performed on all of the memory cells included in one memory block 110.

The memory device 1100 may repeatedly perform a program operation and an erase operation on memory cells, as described above. While the program and erase operations are repeatedly performed, charges may be trapped in, e.g., an insulating layer of a memory cell. As a result, the threshold voltage distribution of the erase state may widen as a program-erase cycle is repeatedly performed. Furthermore, when the program-erase cycle is repeatedly performed, the threshold voltage distribution of the erase state may be changed with respect to the same erase voltage. For example, as the program-erase cycle is repeatedly performed, the entirety of the threshold voltage distribution of the erase state may be moved to the right. In other words, as the program-erase cycle is repeatedly performed, the level of the erase voltage required for each memory cell to have the same erase threshold voltage may be increased.

During the erase operation, as illustrated by the dashed line of FIG. 6C, memory cells that have threshold voltages of the erase state in FIG. 6B may be erased to threshold voltages lower than that of memory cells that have threshold voltages of the program state, i.e., threshold voltages of P1 to P3. In other words, if the erase operation on a memory cell that has a threshold voltage of the erase state is performed by applying an erase voltage to the memory cell again, the memory cell may be erased to a threshold voltage lower than a target erase threshold voltage.

Figure 7:
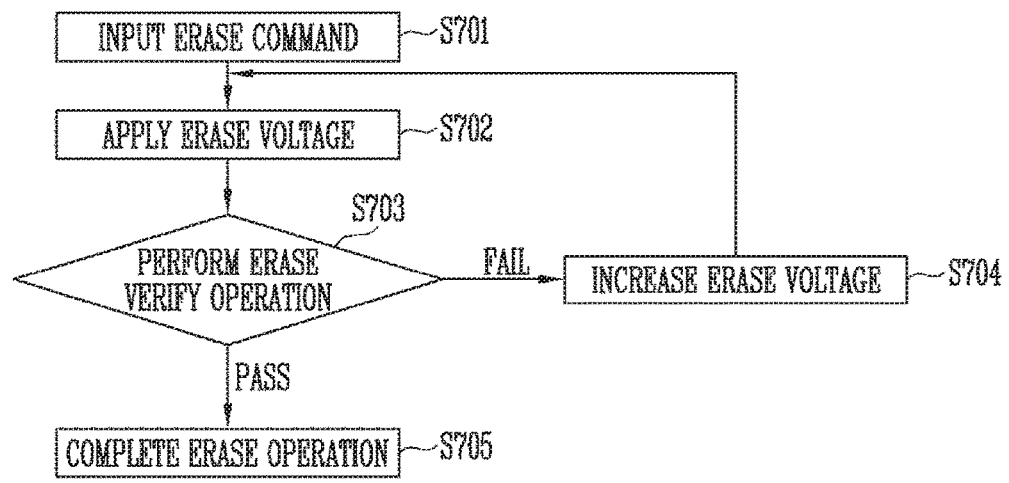
FIG. 7 is a flowchart illustrating an erase operation.

FIG. 7 is a flowchart illustrating an erase operation.

Referring to FIG. 7, the memory device 1100 may receive an erase command from an external device, at step S701. The memory device 1100 may apply an erase voltage to memory cells in response to the erase command, at step S702. Here, the erase voltage may be applied to a well of the memory block 100 on which the erase operation is to be performed. Furthermore, the erase voltage may be applied to the source line SL. In the case of the memory block 110 having a three-dimensional structure described with reference to FIGS. 4 and 5, the erase voltage may be applied to the well or the source line SL and transmitted to a channel of the memory cells included in the memory block 110 on which the erase operation is to be performed.

After the erase voltage has been applied to the memory cells, the memory device 1100 may perform an erase verify operation on the memory cells, at step S703. If it is determined that the erase operation has passed during the erase verify operation, the memory device 1100 may complete the erase operation, at step S705. If it is determined that the erase operation has failed in the erase verify operation, the memory device 1100 may increase the erase voltage, at step S704, and then perform the operation of step S702 again. Here, the erase voltage may be applied to the well or the source line SL of the memory block 110. In an embodiment, at step S704, the voltage to be applied to the well or the source line SL may be fixed or changed and, additionally, a voltage to be applied to the word lines of the memory block 110 may be changed. In other words, the memory device 1100 may fix the voltage to be applied to the well or the source line SL and reduce the voltage to be applied to the word lines of the memory block 110 before performing the operation of step S704 again.

Figure 8:
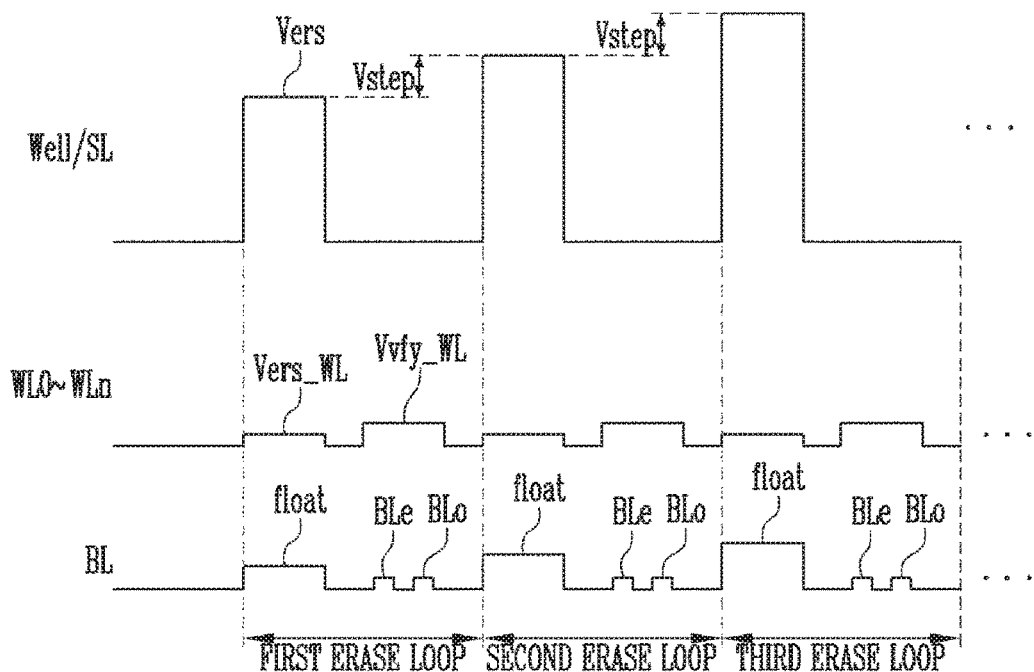
FIG. 8 is a timing diagram illustrating the erase operation described with reference to FIG. 7.

FIG. 8 is a timing diagram illustrating the erase operation described with reference to FIG. 7.

Referring to FIG. 8, the erase operation on target memory cells may be formed of a plurality of erase loops. Each erase loop may include an erase voltage application operation and an erase verify operation. The erase voltage application operation may be an operation of applying an erase voltage to the memory cells and reducing the threshold voltages of the memory cells. The erase verify operation may be an operation of determining whether the threshold voltages of the memory cells have reached target erase voltages.

To perform the erase operation, an erase voltage Vers may be applied to the source line SL or the wells of the memory cells. The erase voltage Vers may be a positive voltage having a level suitable for extracting electrons from floating gates or charge trap layers of the memory cells. While the erase voltage Vers is applied to the source line SL or the wells of the memory cells, an erase word line voltage Vers_WL may be applied to the word lines WL0 to WLn coupled to the memory block 110 on which the erase operation is to be performed. The electrons in the floating gates or the charge trap layers of the memory cells may be extracted therefrom by an electric field generated by the erase voltage Vers and the erase word line voltage Vers_WL. As a result, the threshold voltages of the memory cells may be reduced. While the erase voltage Vers is applied to the memory cells, the bit lines may float.

After the erase voltage application operation has been performed, the erase verify operation may be performed. The erase verify operation may be an operation of determining whether the threshold voltage of each target memory cell is lower than the target threshold voltage. The memory device 1100 may simultaneously perform the erase verify operation on the memory cells of the memory block 110 by simultaneously applying an erase verify voltage Vvfy_WL to all of the word lines coupled to the memory block 110 on which the erase operation has been performed. Furthermore, the memory device 1100 may perform the verify operation by simultaneously applying an erase verify voltage Vvfy_WL to a plurality of word lines coupled to the memory block 110 on which the erase operation has been performed. This operation may be called a hard erase verify operation. Here, the erase verify voltage Vvfy_WL may be the same voltage for all of the word lines, or a constant voltage or a variable voltage may be applied to each word line. Alternatively, the memory device 1100 may individually perform the verify operation on a word line basis by sequentially erase verify voltages Vvfy_WL to the word lines coupled to the memory block 110 on which the erase operation has been performed. This operation may be called a soft erase verify operation. In the case of the hard erase verify operation, the time it takes to perform the erase verify operation may be reduced, compared to that of the soft erase verify operation.

The erase verify voltage Vvfy_WL to be applied to the word lines during the hard erase verify operation may be slightly higher than the target erase threshold voltage. For example, when the target erase threshold voltage is 0 V, the erase verify voltage Vvfy_WL may be 0.5 V, which is slightly higher than 0 V. This difference may be for compensating for an error resulting from channel resistance generated when the erase verify voltage Vvfy_WL is simultaneously applied to a plurality of word lines.

The erase verify operation may be sequentially performed on memory cells coupled to even bit lines BLe and memory cells coupled to odd bit lines BLo, as illustrated in FIG. 8. In this case, while the erase verify operation is performed on the memory cells coupled to the even bit lines BLe, the odd bit lines BLo may be maintained at the ground voltage. On the other hand, while the erase verify operation is performed on the memory cells coupled to the odd bit lines BLo, the even bit lines BLe may be maintained at the ground voltage. Alternatively, the erase verify operation may be simultaneously performed on the memory cells coupled to the even bit lines BLe and the memory cells coupled to the odd bit lines BLo.

If it is determined that the erase operation of the memory block 110 has failed in the erase verify operation of a first erase loop, the memory device 1100 may increase the erase voltage Vers by a predetermined voltage Vstep and then perform a second erase loop. If it is determined that target memory cells have passed the erase verify operation of the second erase loop, the erase operation may be completed. On the other hand, if it is determined that the erase operation has failed in the erase verify operation of the second erase loop, a third erase loop may be performed, as illustrated in FIG. 8. The third erase loop may be performed using an erase voltage higher than that of the second erase loop.

Figure 9:
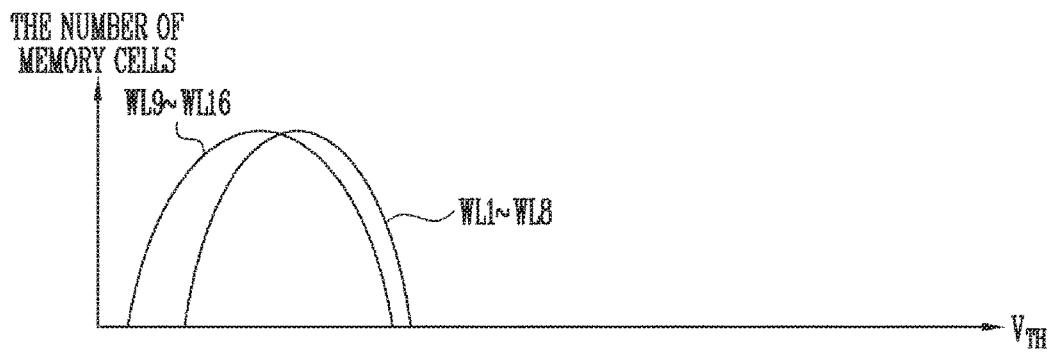
FIG. 9 is a diagram illustrating an erase threshold voltage distribution of each physical page.

FIG. 9 is a diagram illustrating an erase threshold voltage distribution of each physical page.

Referring to FIG. 9, when an erase operation is performed on the memory block 110, an erase threshold voltage distribution of memory cells of the memory block 110 may vary by physical pages, i.e., word lines.

In the memory block 110, a program operation may be performed in a sequence from memory cells coupled to a word line adjacent to the source select line SSL to memory cells coupled to a word line adjacent to the drain select line DSL. In other words, referring to FIGS. 3 to 5, the program operation may be performed in a sequence from memory cells coupled to the lowest numbered word line to memory cells coupled to the highest numbered word line. For example, after a program operation has been performed on memory cells coupled to some word lines adjacent to the source select line SSL among the memory cells included in the memory block 110 while a program operation is not performed on memory cells coupled to word lines adjacent to the drain select line DSL, an erase operation may be performed on the memory block 110. In this case, the erase threshold voltage distribution of the programmed memory cells coupled to the some word lines adjacent to the source select line SSL may differ from the erase threshold voltage distribution of the unprogrammed memory cells coupled to the word lines adjacent to the drain select line DSL.

For instance, FIG. 9 illustrates both an erase threshold voltage distribution of memory cells coupled to first to eighth word lines WL1 to WL8 on which an erase operation has been performed after a program operation has been performed, and an erase threshold voltage distribution of memory cells coupled to ninth to sixteenth word lines WL9 to WL16 on which an erase operation has been performed without a program operation. The erase threshold voltage distribution of the memory cells coupled to the ninth to sixteenth word lines WL9 to WL16 on which the erase operation has been performed without the program operation may have an average threshold voltage lower than that of the erase threshold voltage distribution of the memory cells coupled to the first to eighth word lines WL1 to WL8 on which the erase operation has been performed after the program operation has been performed. In other words, the memory cells coupled to the ninth to sixteenth word lines WL9 to WL16 on which the erase operation has been performed without the program operation may be excessively erased, compared to that of the memory cells coupled to the first to eighth word lines WL1 to WL8 on which the erase operation has been performed after the program operation has been performed.

Furthermore, the erase threshold voltage distribution of the memory cells coupled to the ninth to sixteenth word lines WL9 to WL16 on which the erase operation has been performed without the program operation may be wider than that of the erase threshold voltage distribution of the memory cells coupled to the first to eighth word lines WL1 to WL8 on which the erase operation has been performed after the program operation has been performed. This results from the fact that the memory cells coupled to the ninth to sixteenth word lines WL9 to WL16 on which the erase operation has been performed without the program operation are in an erased state when the erase operation is performed again.

The degree to which the memory cells are excessively erased or the erase threshold voltage distribution widens may be increased as the program-erase cycle is repeatedly performed on the memory cells. This phenomenon in which the memory cells are excessively erased or the erase threshold voltage distribution widens may deteriorate the reliability of the memory cells.

Figure 10:
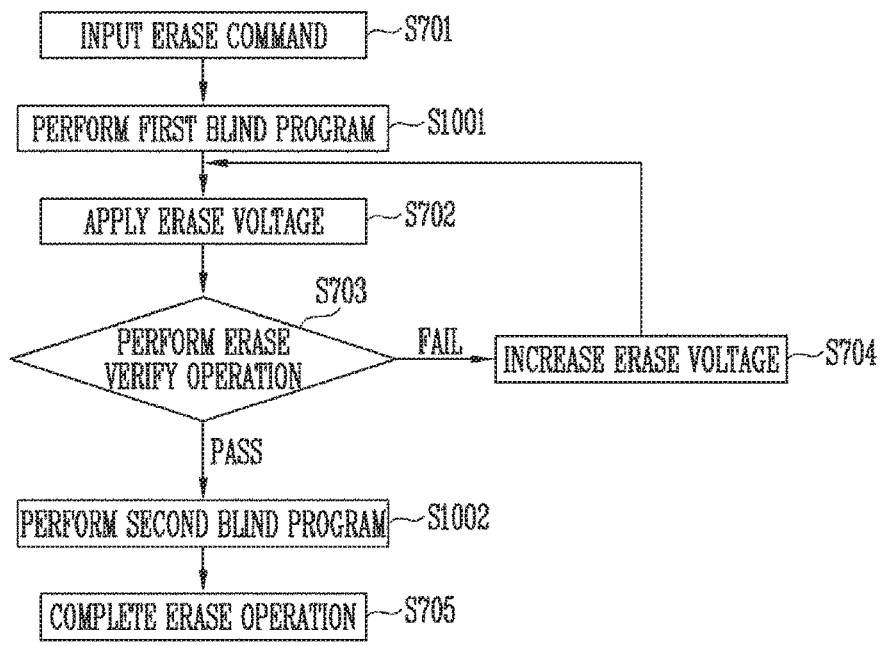
FIG. 10 is a flowchart illustrating an erase operation in accordance with an embodiment of the present disclosure.

FIG. 10 is a flowchart illustrating an erase operation in accordance with an embodiment of the present disclosure.

Referring to FIG. 10, when the erase operation is performed, the memory device 1100 may perform a first blind program operation before an erase voltage is applied to memory cells, at step S1001. The first blind program operation may be performed by simultaneously applying a first blind program voltage to all of the word lines coupled to the memory block 110. In other words, the first blind program voltage may be applied to all of the memory cells regardless of whether the memory cells included in the memory block 110 are in the program state or the erase state. Furthermore, the first blind program operation may be performed by simultaneously applying the first blind program voltage to a plurality of word lines coupled to the memory block 110. The first blind program operation may particularly provide an effect of increasing the threshold voltages of memory cells having threshold voltages that are in the erase state. Thanks to the first blind program operation, the excessive erase phenomenon may be mitigated. As described above, the excessive erase phenomenon may be caused by performing an erase operation again on memory cells having threshold voltages that are in the erase state. Therefore, the excessive erase phenomenon may be mitigated by programming the memory cells having low threshold voltages through the first blind program operation before the erase voltage is applied to the memory cells.

During the erase operation, at step S1002, the memory device 1100 may perform a second blind program operation after the memory cells have passed an erase verify operation. The second blind program operation may be performed by simultaneously applying a second blind program voltage to all of the word lines coupled to the memory block 110. Furthermore, the second blind program operation may be performed by simultaneously applying the second blind program voltage to a plurality of word lines coupled to the memory block 110. The second blind program operation may provide an effect of increasing the threshold voltages of some memory cells that have been excessively erased during the preceding erase voltage application operation. During the second blind program operation, the threshold voltages of the excessively-erased memory cells described with reference to FIG. 9 are increased again, whereby the size of the overall erase threshold voltage distribution may be reduced.

As illustrated in FIG. 10, during the erase operation, the memory device 1100 may perform both the first blind program operation S1001 and the second blind program operation S1002. During the erase operation, the memory device 1100 may perform the first blind program operation S1001 but may not perform the second blind program operation S1002. In addition, during the erase operation, the memory device 1100 may perform the second blind program operation S1002 but may not perform the first blind program operation S1001.

Figure 11:
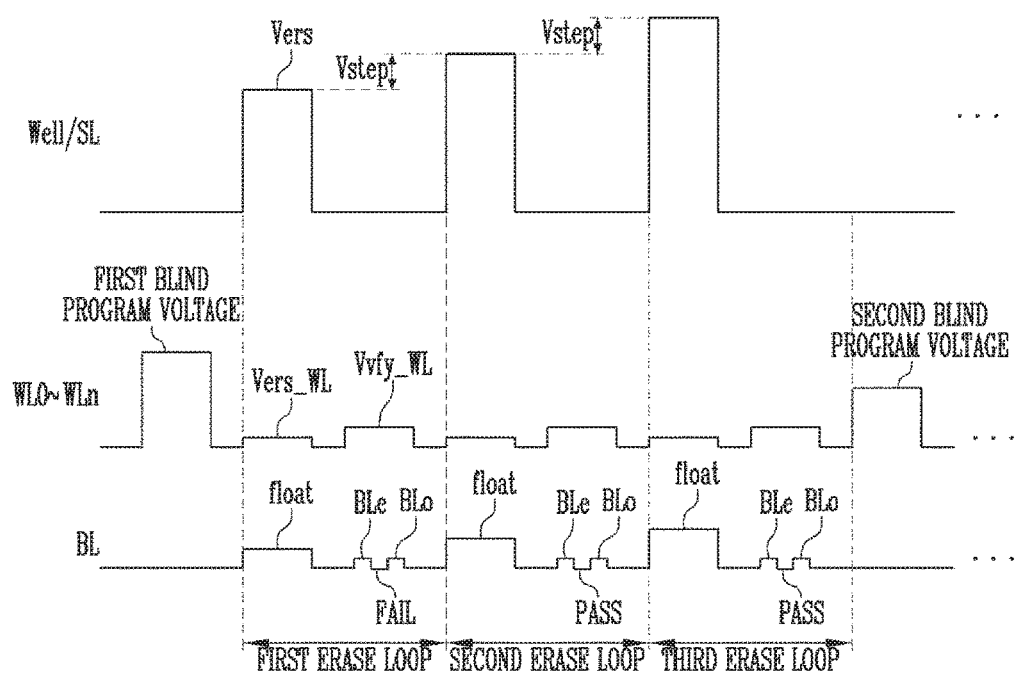
FIG. 11 is a timing diagram illustrating the erase operation of FIG. 10.

FIG. 11 is a timing diagram illustrating the erase operation described with reference to FIG. 10.

Referring to FIG. 11, the memory device 1100 may perform the first blind program operation before an erase voltage Vers is applied to the memory block 110 to be erased. The first blind program operation may be performed by applying a first blind program voltage to a word line coupled to the memory block 110 to be erased. Alternatively, the first blind program operation may be performed by simultaneously applying the first blind program voltage to all of the word lines coupled to the memory block 110. As a further alternative, the first blind program operation may be performed by simultaneously applying the first blind program voltage to a plurality of word lines coupled to the memory block 110. The first blind program voltage may be the same voltage or different voltages to be applied to the all word lines coupled to the memory block 110 to be erased.

When it is determined that the erase operation has passed during the erase verify operation, the memory device 1100 may perform the second blind program operation before the erase operation is completed. The second blind program operation may be performed by applying a second blind program voltage to a word line coupled to the memory block 110 on which the erase operation has been performed. Alternatively, the second blind program operation may be performed by simultaneously applying the second blind program voltage to all of the word lines coupled to the memory block 110. As a further alternative, the second blind program operation may be performed by simultaneously applying the second blind program voltage to a plurality of word lines coupled to the memory block 110. The second blind program voltage may be the same voltage or different voltages to be applied to the all word lines coupled to the memory block 110. The second blind program voltage may be different from the first blind program voltage. Furthermore, the second blind program voltage may be lower than the first blind program voltage.

While the first blind program voltage is applied to the memory block 110, the ground voltage may be applied to the bit lines. Furthermore, while the second blind program voltage is applied to the memory block 110, the ground voltage may be applied to the bit lines.

Figure 12:
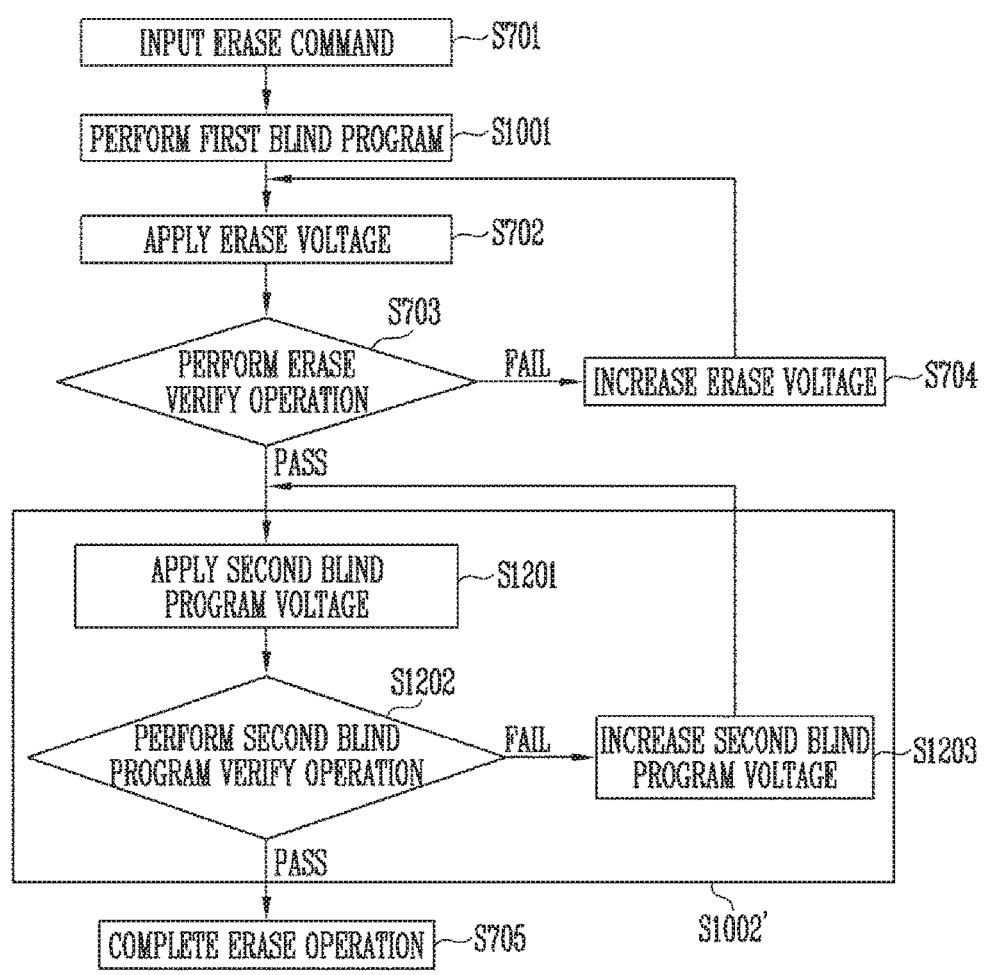
FIG. 12 is a flowchart illustrating an erase operation in accordance with an embodiment of the present disclosure.

FIG. 12 is a flowchart illustrating an erase operation in accordance with an embodiment of the present disclosure.

Referring to FIG. 12, a second blind program operation (step S1002') may include an operation (step S1201) of first applying a second blind program voltage to word lines coupled to the memory block 110. The operation of step S1201 may be the same operation as that of step S1002 of FIG. 10. After the operation of step S1201 has been performed, the memory device 1100 may perform a second blind program verify operation, at step S1202. The second blind program verify operation (step S1202) may be an operation of determining whether a threshold voltage distribution of the memory cells has formed a target threshold voltage distribution during the operation of step S1201. For example, the second blind program verify operation (step S1202) may be performed by simultaneously applying a second blind program verify voltage Vvfy2_WL to all of the word lines coupled to the memory block 110. Alternatively, the second blind program verify operation (step S1202) may be performed by simultaneously applying the second blind program verify voltage Vvfy2_WL to a plurality of word lines coupled to the memory block 110. For example, during the second blind program verify operation (step S1202), if a string ST that has been determined to be turned off is present when the second blind program verify voltage Vvfy2_WL is simultaneously applied to a plurality of word lines coupled to the memory block 110, it may be determined that the second blind program operation has passed. As an example, during the second blind program verify operation (step S1202), if the number of strings ST that have been determined to be turned off is a predetermined value or more when the second blind program verify voltage Vvfy2_WL is simultaneously applied to a plurality of word lines coupled to the memory block 110, it may be determined that the second blind program operation has passed.

As an example, during the second blind program verify operation (step S1202), if a string ST that has been determined to be turned on is not present when the second blind program verify voltage Vvfy2_WL is simultaneously applied to a plurality of word lines coupled to the memory block 110, i.e., if it is determined that all of the strings ST have been turned off, it may be determined that the second blind program operation has passed. As an example, during the second blind program verify operation (step S1202), if the number of strings ST that have been determined to be turned on is a predetermined value or less when the second blind program verify voltage Vvfy2_WL is simultaneously applied to a plurality of word lines coupled to the memory block 110, it may be determined that the second blind program operation has passed.

The second blind program verify voltage Vvfy2_WL may be the same as the erase verify voltage Vvfy_WL. Alternatively, the second blind program verify voltage Vvfy2_WL may differ from the erase verify voltage Vvfy_WL. In other words, the second blind program verify voltage Vvfy2_WL may be lower or higher than the erase verify voltage Vvfy_W L.

If it is determined that the second blind program verify operation (step S1202) has failed, the memory device 1100 may increase the second blind program voltage, at step S1203. Thereafter, the memory device 1100 may perform the operation of step S1201 using the increased second blind program voltage. The width of the erase threshold voltage distribution of the memory cells may be reduced using the second blind program voltage that is successively increased.

Figure 13:
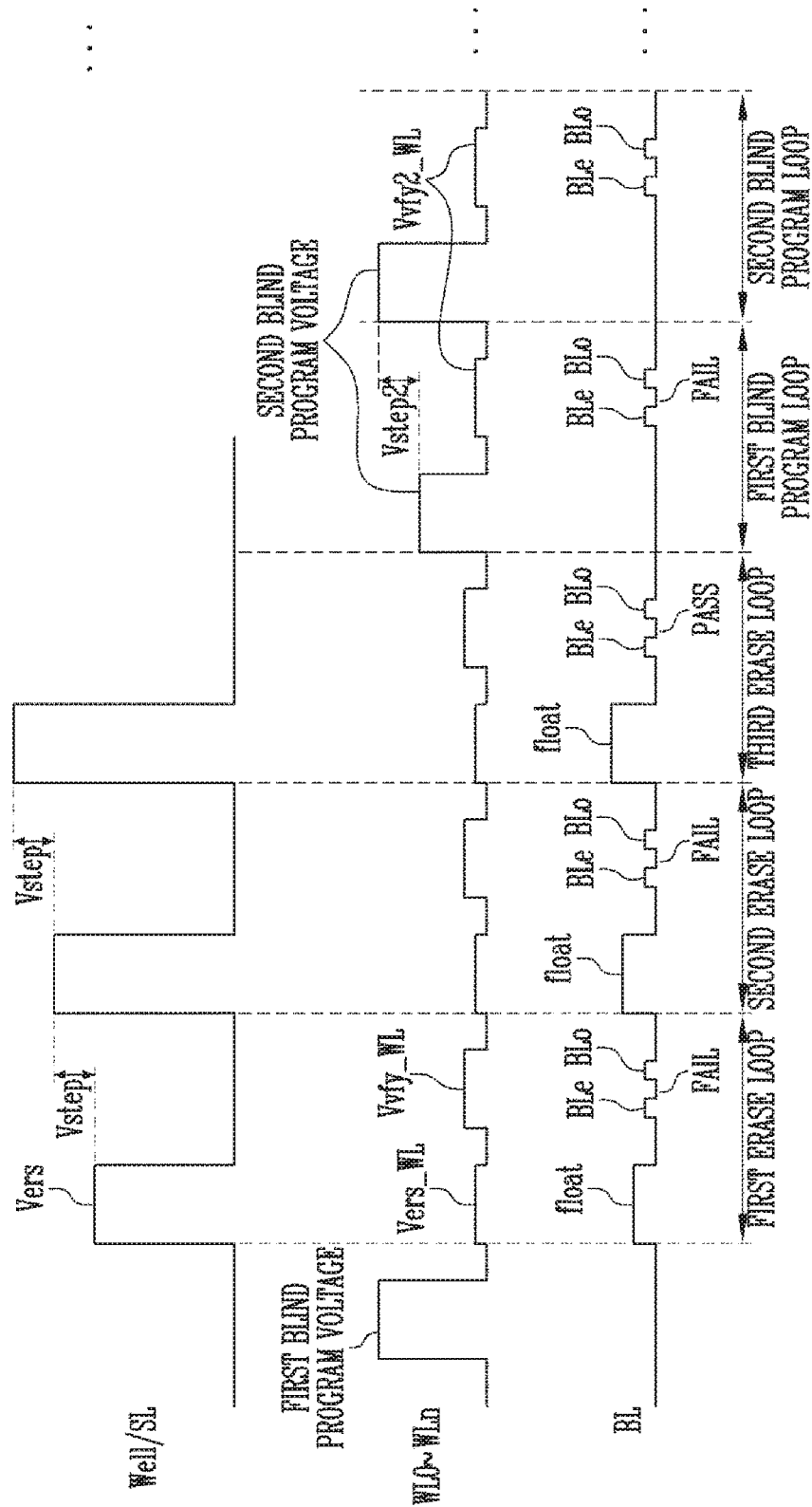
FIG. 13 is a timing diagram illustrating the erase operation of FIG. 12.

FIG. 13 is a timing diagram illustrating the erase operation described with reference to FIG. 12.

Referring to FIG. 13, the second blind program operation on target memory cells may be formed of a plurality of blind program loops. Each blind program loop may include a second blind program voltage application operation and a second blind program verify operation. The second blind program voltage application operation may be an operation of increasing the threshold voltages of the memory cells by applying the second blind program voltage to word lines coupled to the memory block 110 on which the erase operation is to be performed. The second blind program verify operation may be an operation of determining whether the threshold voltage distribution of the memory cells has reached a target program distribution.

The memory device 1100 may perform the second blind program operation after the erase operation has been determined to have passed through the erase verify operation. During the second blind program operation, the memory device 1100 may first apply a second blind program voltage to word lines coupled to the memory block 110 on which the erase operation has been performed. The second blind program voltage may be simultaneously applied to a plurality of or all of the word lines coupled to the memory block 110 on which the erase operation has been performed. Furthermore, the second blind program voltage may be lower than the first blind program voltage.

After the second blind program voltage application operation has been performed, the memory device 1100 may perform the second blind program verify operation. The second blind program verify operation may be performed by applying a second blind program verify voltage Vvfy2_WL to a word line coupled to the memory block 110. For example, the second blind program verify operation may be performed by simultaneously applying a second blind program verify voltage Vvfy2_WL to a plurality of or all of the word lines coupled to the memory block 110. For example, during the second blind program verify operation, if a string ST that has been determined to be turned off is present when the second blind program verify voltage Vvfy2_WL is simultaneously applied to a plurality of or all of the word lines coupled to the memory block 110, it may be determined that the second blind program operation has passed. As an example, during the second blind program verify operation, if the number of strings ST that have been determined to be turned off is a predetermined value or more when the second blind program verify voltage Vvfy2_WL is simultaneously applied to a plurality of or all of the word lines coupled to the memory block 110, it may be determined that the second blind program operation has passed.

As an example, during the second blind program verify operation, if a string ST that has been determined to be turned on is not present when the second blind program verify voltage Vvfy2_WL is simultaneously applied to a plurality of or all of the word lines coupled to the memory block 110, i.e., if it is determined that all of the strings ST have been turned off, it may be determined that the second blind program operation has passed. As an example, during the second blind program verify operation, if the number of strings ST that have been determined to be turned on is a predetermined value or less when the second blind program verify voltage Vvfy2_WL is simultaneously applied to a plurality of or all of the word lines coupled to the memory block 110, it may be determined that the second blind program operation has passed.

The second blind program verify operation may be sequentially performed on memory cells coupled to even bit lines BLe and memory cells coupled to odd bit lines BLo, as illustrated in FIG. 13. In this case, while the second blind program verify operation is performed on the memory cells coupled to the even bit lines BLe, the odd bit lines BLo may be maintained at the ground voltage. On the other hand, while the second blind program verify operation is performed on the memory cells coupled to the odd bit lines BLo, the even bit lines BLe may be maintained at the ground voltage. The second blind verify operation may be simultaneously performed on the memory cells coupled to even bit lines BLe and the memory cells coupled to odd bit lines BLo, unlike illustrated in FIG. 13.

As illustrated in FIG. 13, as a result of the second blind program verify operation performed during the first blind program loop, if it is determined that the second blind program operation has failed, the second blind program loop may be performed. The second blind program loop may be performed using a second blind program voltage higher than that of the first blind program loop by a predetermined voltage Vstep2.

Figure 14:
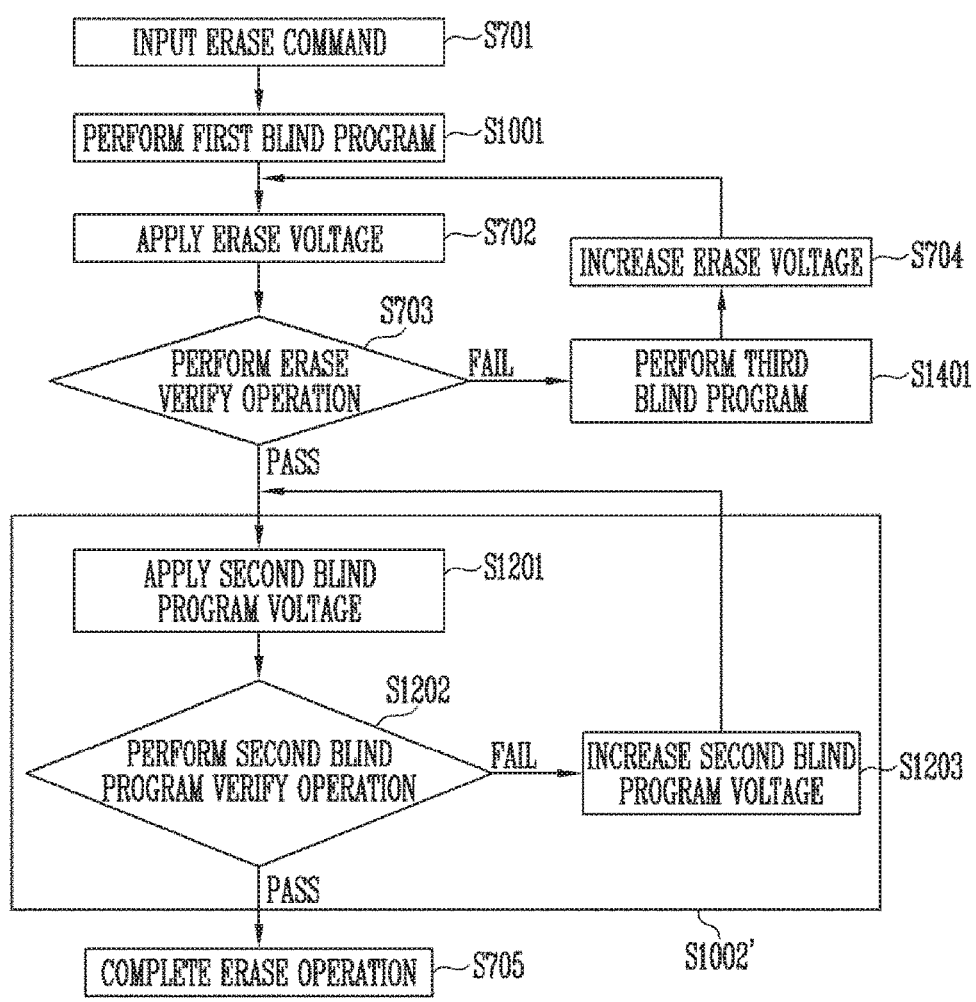
FIG. 14 is a flowchart illustrating an erase operation in accordance with an embodiment of the present disclosure.

FIG. 14 is a flowchart illustrating an erase operation in accordance with an embodiment of the present disclosure.

Referring to FIG. 14, the erase operation may be performed in a manner similar to the method described with reference to FIG. 12, and may further include a third blind program operation (step S1401). For example, if it is determined that the erase operation has failed at step S703, the memory device 1100 may perform the third blind program operation (step S1401), before increasing the erase voltage Vers (at step S704) and applying the increased erase voltage to the memory block 110 again (at step S702). In other words, if it is determined that the erase operation has failed in the erase verify operation (step S703) after each erase loop has been performed, the third blind program operation may be performed before the step S704 of increasing the erase voltage is performed. The third blind program operation may be performed by applying a third blind program voltage to a word line coupled to the memory block 110 on which the erase operation has been performed. Alternatively, the third blind program operation may be performed by simultaneously applying the third blind program voltage to a plurality of or all of the word lines coupled to the memory block 110 on which the erase operation has been performed. The third blind program voltage may be the same voltage to be applied to a plurality of or all of the word lines coupled to the memory block 110 on which the erase operation has been performed. Alternatively, the third blind program voltage may be the same voltage or different voltages to be applied to the respective word lines.

The width of the erase threshold voltage distribution of the memory cells may be further reduced by the third blind program operation (step S1401). Furthermore, the excessive erase phenomenon of the memory cells may be further mitigated by the third blind program operation. Thereby, the reliability of the memory device 1100 may be further enhanced.

The second blind program operation of FIG. 14 may be the same operation as that of step S1002' described with reference to FIG. 12. Step S1002' of FIG. 14 may be replaced with step S1002 of FIG. 10. Only one or two of steps S1001, S1002', and S1401 may be performed. For example, only the operation of step S1401 may be performed without the operations of steps S1001 and S1002'. Alternatively, the operations of steps S1401 and S1002' may be performed without the operation of step S1001. In some embodiments, any combination of only two of steps S1001, S1002', and S1401 may be performed. In other embodiments, only one step of S1001, S1002', and S1401 may be performed. In still further embodiments, all three steps of S1001, S1002', and S1401 may be performed.

Figure 15:
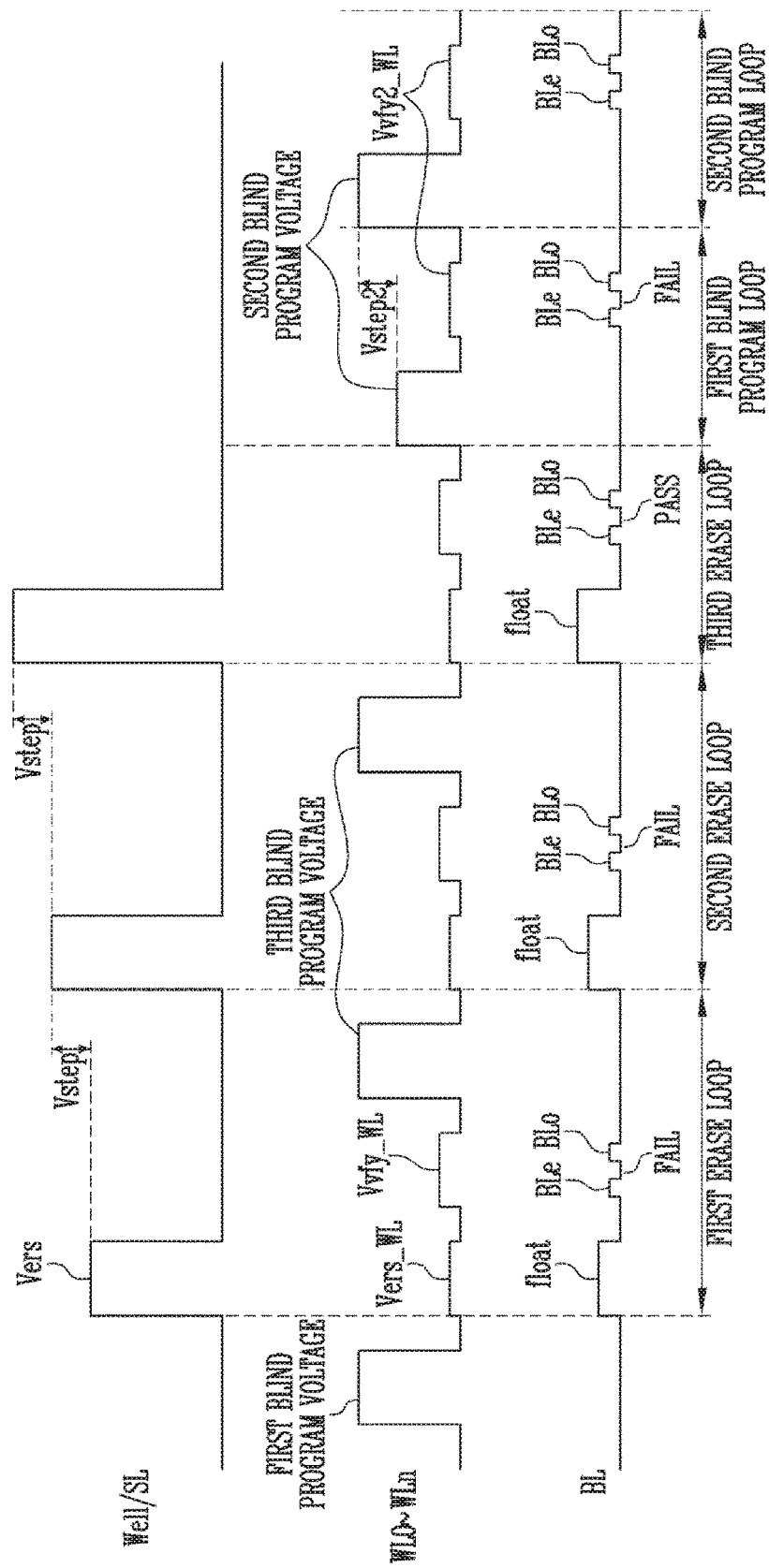
FIG. 15 is a timing diagram illustrating the erase operation of FIG. 14.

FIG. 15 is a timing diagram illustrating the erase operation described with reference to FIG. 14.

Referring to FIG. 15, when it is determined that the erase operation has failed in the erase verify operation, the third blind program operation may be performed. The third blind program operation may be performed by applying the third blind program voltage to a word line coupled to the memory block 110 on which the erase operation is to be performed. Alternatively, the third blind program operation may be performed by simultaneously applying the third blind program voltage to a plurality of or all of the word lines coupled to the memory block 110 on which the erase operation is to be performed. The third blind program voltage may be the same voltage to be applied to a plurality of or all of the word lines. Alternatively, the third blind program voltage may be the same voltage or different voltages to be applied to the respective word lines.

The third blind program voltage to be used during the third blind program operation to be performed during the first erase loop may be the same as the third blind program voltage to be used during the third blind program operation to be performed during the second erase loop. In other words, the third blind program voltage may be the same voltage to be used during a plurality of erase loops. Alternatively, the third blind program voltage may be different voltages to be used during a plurality of erase loops.

The third blind program voltage may be different from the first blind program voltage. In addition, the third blind program voltage may be lower than the first blind program voltage. The third blind program voltage may be the same as the second blind program voltage. Alternatively, the third blind program voltage may be higher than the second blind program voltage.

While the third blind program voltage is applied to a word line coupled to the memory block 110 on which the erase operation is being performed, the ground voltage may be applied to the bit lines.

Figure 16:
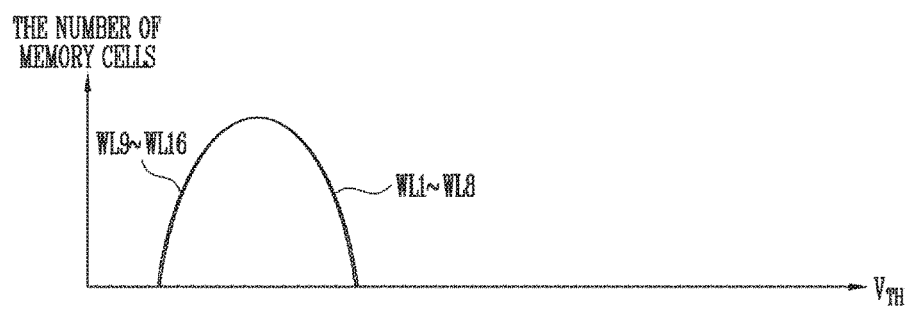
FIG. 16 is a diagram illustrating an erase threshold voltage distribution of each physical page in accordance with an embodiment of the present disclosure.

FIG. 16 is a diagram illustrating an erase threshold voltage distribution of each physical page in accordance with an embodiment of the present disclosure.

FIG. 16 illustrates the erase threshold voltage distribution of the memory cells of the memory block 110 on which the erase operation has been performed by the method described with reference to FIGS. 10 to 15. For instance, there is illustrated both an erase threshold voltage distribution of memory cells coupled to first to eighth word lines WL1 to WL8 on which an erase operation has been performed after a program operation has been performed, and an erase threshold voltage distribution of memory cells coupled to ninth to sixteenth word lines WL9 to WL16 on which an erase operation has been performed without a program operation. As a result of performing one or more of the first to third blind program operations on the memory cells coupled to the ninth to sixteenth word lines WL9 to WL16, it may be understood that there is little difference between the erase threshold voltage distributions by the word lines, unlike the case of FIG. 9. In other words, the excessive erase phenomenon or the phenomenon in which the width of the erase threshold voltage distribution is excessively increased may be mitigated by the first to third blind program operations.

Figure 17:
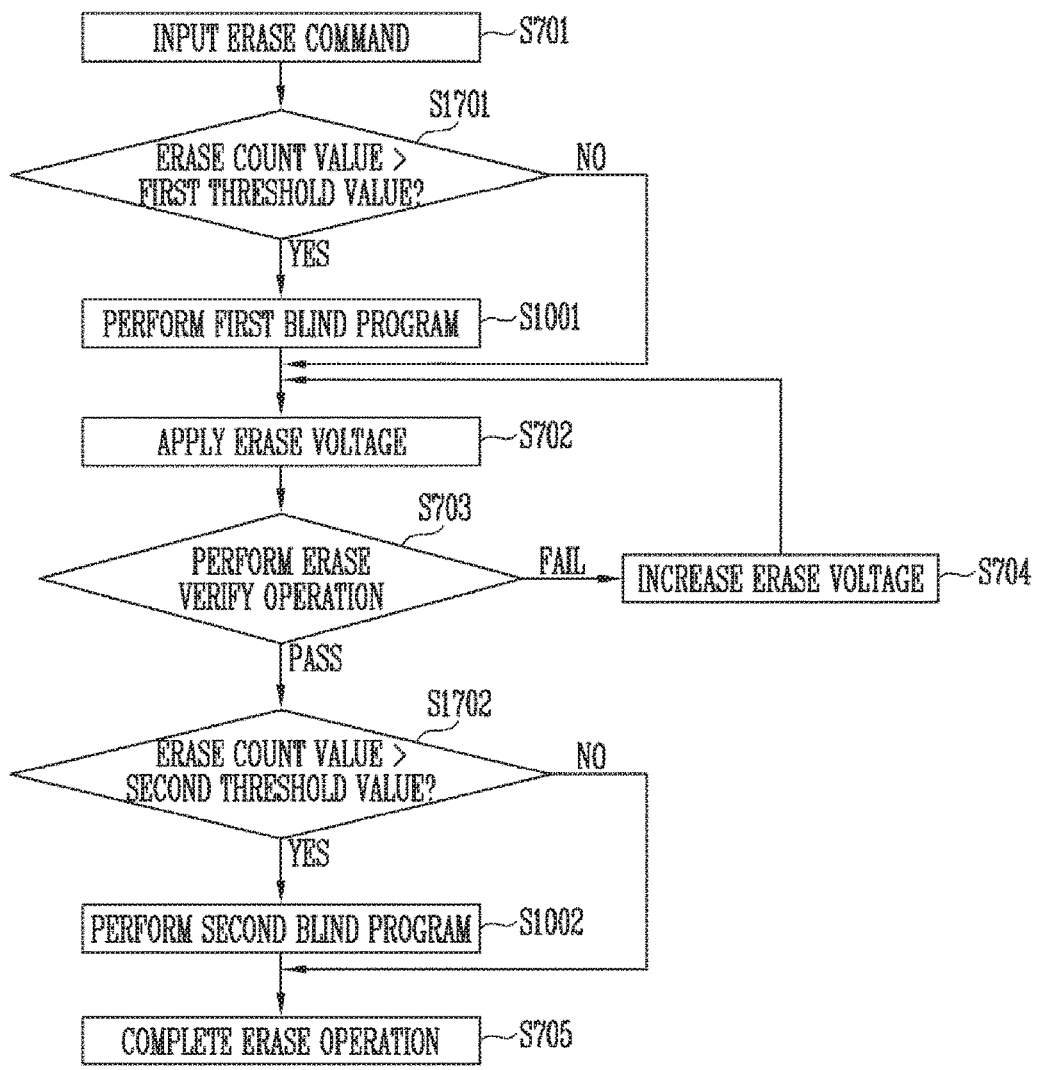
FIG. 17 is a flowchart illustrating an erase operation in accordance with an embodiment of the present disclosure.

FIG. 17 is a flowchart illustrating an erase operation in accordance with an embodiment of the present disclosure.

Referring to FIG. 17, the erase operation may be performed in a manner similar to the method described with reference to FIG. 10. In this case, the memory device may perform the first blind program operation (step S1001) when an erase count value of the memory block is greater than a predetermined first threshold value. In addition, the memory device may also perform the second blind program operation (step S1002) when an erase count value of the memory block is greater than a predetermined second threshold value.

Specifically, after the memory device 100 received the erase command at step S701, the erase count of the memory block may be compared with the first threshold value (step S1701). The erase count value may represent the number of times the memory block is erased. As program-erase operation of the memory block is repeated, the threshold voltage characteristics of the memory cells may deteriorate. Therefore, the erase operation according to the embodiment of the present disclosure may perform the first blind program operation (step S1001) only when the erase count value is greater than the first threshold value. The first blind program operation may be performed by simultaneously applying the first blind program voltage to all the word lines coupled to the memory block 110.

During the erase operation, at step S703, the memory device 1100 may compare the erase count value of the memory block with the predetermined second threshold value after the memory cells have passed an erase verify operation. As described above, as program-erase operation of the memory block is repeated, the threshold voltage characteristics of the memory cells may deteriorate. Therefore, the erase operation according to the embodiment of the present disclosure may perform the second blind program operation (step S1002) only when the erase count value is greater than the second threshold value. The first threshold value and the second threshold value may be determined to be the same value or different values.

The erase method described by FIG. 17 is substantially the same as the erase method described by FIG. 10, except that the first blind program is performed (step S1001) only when the erase count value is greater than the first threshold value, and the second blind program is performed (step S1002) only when the erase count value is greater than the second threshold value.

Figure 18:
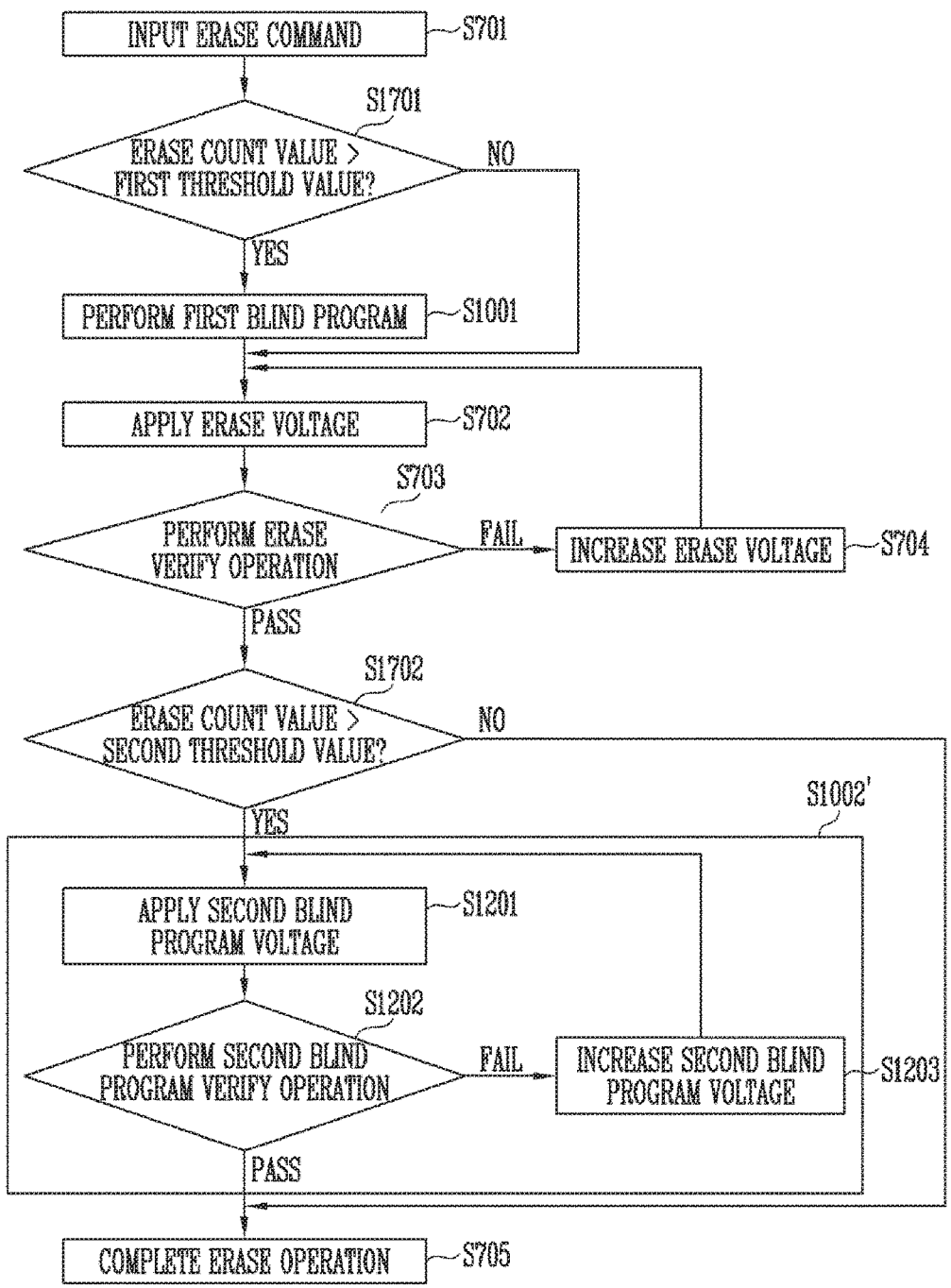
FIG. 18 is a flowchart illustrating an erase operation in accordance with an embodiment of the present disclosure.

FIG. 18 is a flowchart illustrating an erase operation in accordance with an embodiment of the present disclosure.

Referring to FIG. 18, the erase operation may be performed in a manner similar to the method described with reference to FIG. 12. In this case, the memory device may perform the first blind program operation (step S1001) when an erase count value of the memory block is greater than a predetermined first threshold value. In addition, the memory device may also perform the second blind program operation (step S1002) when an erase count value of the memory block is greater than a predetermined second threshold value.

Specifically, after the memory device 100 received the erase command at step S701, the erase count of the memory block may be compared with the first threshold value (step S1701). The erase count value may represent the number of times the memory block is erased. As program-erase operation of the memory block is repeated, the threshold voltage characteristics of the memory cells may deteriorate. Therefore, the erase operation according to the embodiment of the present disclosure may perform the first blind program operation (step S1001) only when the erase count value is greater than the first threshold value.

After the erase voltage has been applied to the memory cells, the memory device 1100 may perform an erase verify operation on the memory cells, at step S703. If it is determined that the erase operation has passed during the erase verify operation, the memory device 1100 may compare the erase count value of the memory block with the second threshold value (step S1702). In FIG. 18, the second blind program operation (step S1002') may be performed only when the erase count value is greater than the second threshold value. The first threshold value and the second threshold value may be determined to be the same value or different values.

The erase method described by FIG. 18 is substantially the same as the erase method described by FIG. 12, except that the first blind program is performed (step S1001) only when the erase count value is greater than the first threshold value, and the second blind program is performed (step S1002'). only when the erase count value is greater than the second threshold value.

Figure 19:
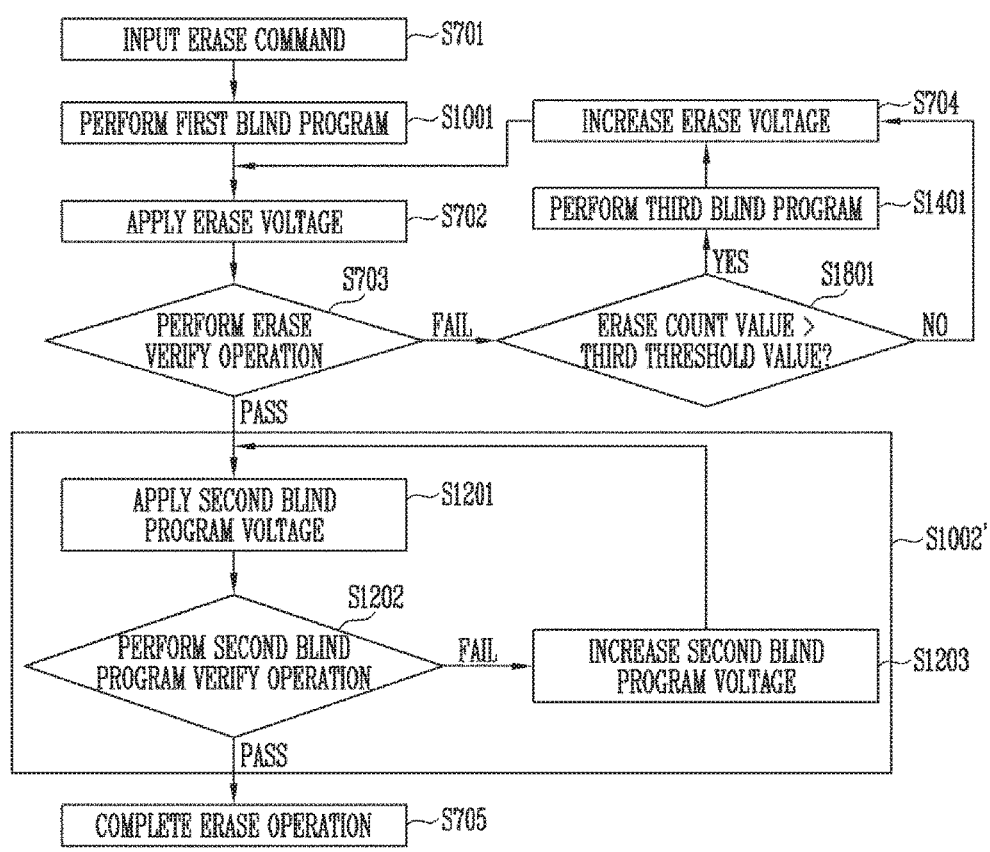
FIG. 19 is a flowchart illustrating an erase operation in accordance with an embodiment of the present disclosure.

FIG. 19 is a flowchart illustrating an erase operation in accordance with an embodiment of the present disclosure.

Referring to FIG. 19, the erase operation may be performed in a manner similar to the method described with reference to FIG. 14. In this case, before the third blind program operation (step S1401), the operation of comparing the erase count value of the memory block with a predetermined third threshold value (step S1801) may be further performed.

More specifically, if it is determined that the erase operation has failed at step S703, the memory device 1100 may compare the erase count value of the memory block with the third threshold value (step S1801). As a result of comparison, the third blind program operation is performed (step S1401) if the erase count value is greater than the third threshold value, and then the erase voltage can be increased (step S704).

On the other hand, if the erase count value is less than or equal to the third threshold value, the erase voltage may be increased (step S704) without performing the third blind program operation.

The third threshold value may be determined to be equal to at least one of the first threshold value and the second threshold value described above. Alternatively, the third threshold value may be determined to be a different value from both of the first threshold value and the second threshold value.

The erase method described by FIG. 19 is substantially the same as the erase method described by FIG. 14, except that the third blind program is performed (step S1401) only when the erase count value is greater than the third threshold value.

In an embodiment, though not illustrated in FIG. 19, the memory device may perform the first blind program operation (step S1001) when an erase count value of the memory block is greater than a predetermined first threshold value (i.e., see FIG. 17, S1701). If the erase count value of the memory block is less than a predetermined first threshold value (i.e., see FIG. 17, S1701) the first blind program operation (S1001) is not performed and the erase voltage is applied S702.

In an embodiment, though not illustrated in FIG. 19, at step S703, the memory device 1100 may compare the erase count value of the memory block with the predetermined second threshold value (i.e., S1702 of FIG. 17) after the memory cells have passed an erase verify operation (S703, PASS). According to an embodiment, the second blind program operation (step S1002') may only be performed when the erase count value is greater than the second threshold value otherwise the erase operation may be completed S705. The first threshold value and the second threshold value may be determined to be the same value or different values.

Figure 20:
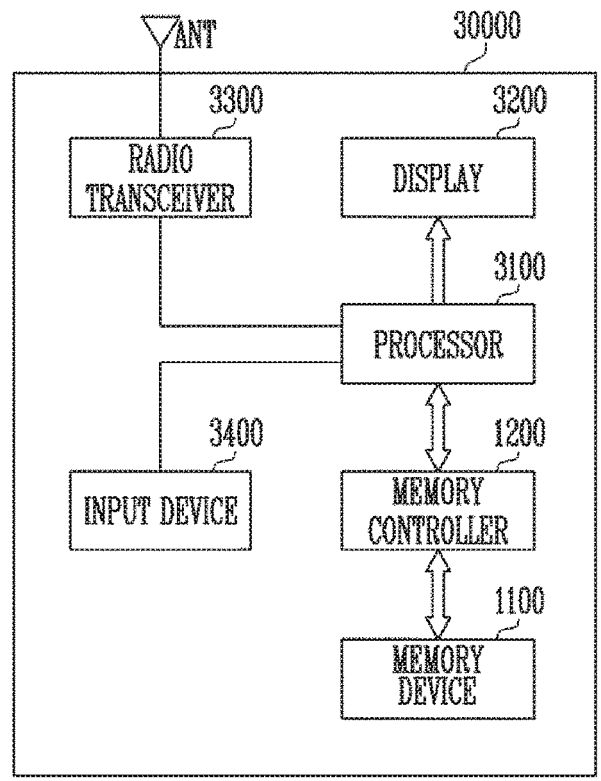
FIG. 20 is a diagram illustrating an embodiment of a memory system including the memory device illustrated in FIG. 2.

FIG. 20 is a diagram illustrating an embodiment of a memory system including the memory device illustrated in FIG. 2.

Referring to FIG. 20, the memory system 30000 may be embodied in a cellular phone, a smartphone, a tablet PC, a personal digital assistant (PDA) or a wireless communication device. The memory system 30000 may includes the memory device 1100, and a memory controller 1200 configured to control the memory device 1100. The memory controller 1200 may control a data access operation, e.g., a program, erase, or read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may change a radio signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal outputted from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied by a pointing device such as a touch pad and a computer mouse, a keypad or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the memory device 1100 may be embodied as a part of the processor 3100 or a chip provided separately from the processor 3100.

Figure 21:
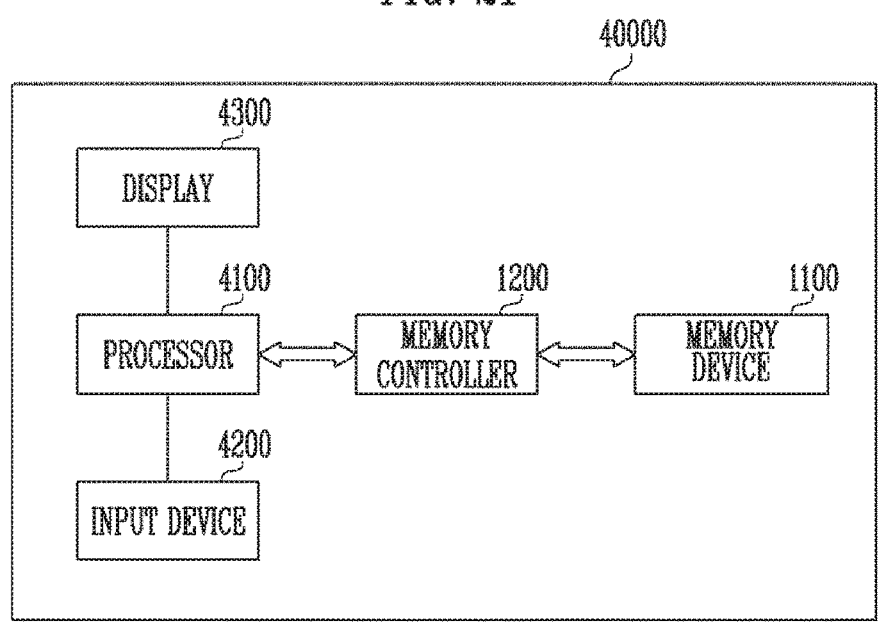
FIG. 21 is a diagram illustrating an embodiment of a memory system including the memory device illustrated in FIG. 2.

FIG. 21 is a diagram illustrating an embodiment of a memory system including the memory device illustrated in FIG. 2.

Referring to FIG. 21, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may includes the memory device 1100, and a memory controller 1200 configured to control a data processing operation of the memory device 1100.

A processor 4100 may output data stored in the memory device 1100 through a display 4300, according to data inputted from an input device 4200. For example, the input device 4200 may be embodied by a pointing device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100.

Figure 22:
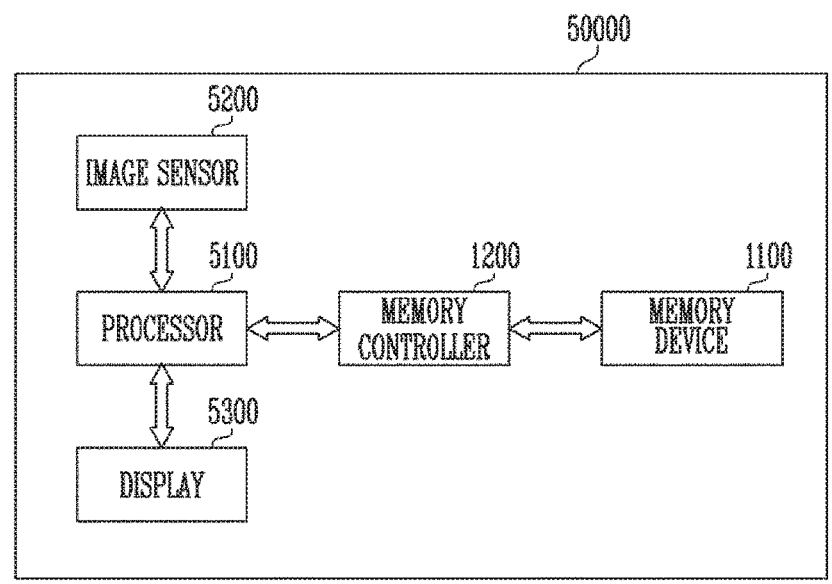
FIG. 22 is a diagram illustrating an embodiment of a memory system including the memory device illustrated in FIG. 2.

FIG. 22 is a diagram illustrating an embodiment of a memory system including the memory device illustrated in FIG. 2.

Referring to FIG. 22, the memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100, and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the memory controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100.

Figure 23:
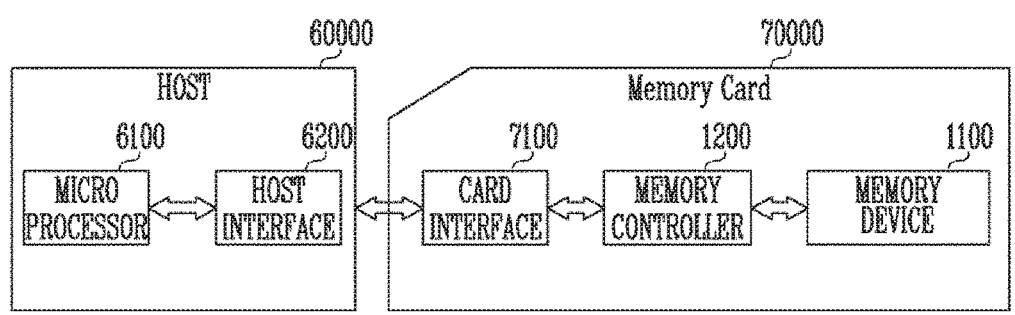
FIG. 23 is a diagram illustrating an embodiment of a memory system including the memory device illustrated in FIG. 2.

FIG. 23 is a diagram illustrating an embodiment of a memory system including the memory device illustrated in FIG. 2.

Referring to FIG. 23, the memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

In various embodiments of the present disclosure, during an erase operation of a memory device, a blind program operation for improving an erase threshold voltage distribution of memory cells may be performed, whereby the reliability of the memory device may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a memory device comprising:
applying an erase voltage to a memory block;
performing an erase verify operation on the memory block to determine whether threshold voltages of memory cells included in the memory block have reached the erase state;
performing a first blind program operation on the memory block if the erase verify operation fails; and
applying a changed erase voltage which has a higher voltage level than the erase voltage to the memory block.

2. The method according to claim 1, wherein the first blind program operation is performed by simultaneously applying a first blind program voltage to a plurality of word lines coupled to the memory block.

3. The method according to claim 1, further comprising, before the applying of the erase voltage, performing a second blind program operation on the memory block.

4. The method according to claim 3, wherein the second blind program operation is performed regardless of whether a program operation has been performed on the memory block.

5. The method according to claim 3, wherein performing the second blind program operation on the memory block includes increasing the threshold voltages of the memory cells.

6. The method according to claim 2, further comprising, after the first blind program operation has been performed:
applying a changed erase voltage having a higher voltage level than the erase voltage to the memory block; and
performing the first blind program operation using a changed first blind program voltage having a higher voltage level than the first blind voltage.

7. The method according to claim 2, further comprising, after applying the changed erase voltage, performing the first blind program operation using the first blind program voltage again.

8. The method according to claim 2, further comprising, after the first blind program operation has been performed:
applying a changed erase voltage having a higher voltage level than the erase voltage to the memory block; and
performing the first blind program operation using a decreased first blind program voltage having a lower voltage level than the first blind voltage.

9. The method according to claim 1, further comprising performing a second blind program operation when the erase verify operation passes.

10. The method according to claim 9,
wherein the second blind program operation includes a plurality of blind program loops, and
wherein each of the blind program loops comprises a second blind program voltage application operation and a blind program verify operation.

11. The method according to claim 10, wherein the blind program verify operation comprises determining that the second blind program operation has passed, when the number of strings that are determined to be turned off is a predetermined value or more.

12. The method according to claim 11, wherein the blind program verify operation is successively performed on memory cells coupled to an even bit line and memory cells coupled to an odd bit line.

13. A method of operating a memory device comprising:
applying an erase voltage to a memory block;
performing an erase verify operation on the memory block to determine whether threshold voltages of memory cells included in the memory block have reached the erase state; and
performing a first blind program operation on the memory block if it is determined that the erase verify operation fails according to an erase count value of the memory block,
wherein the first blind program operation is performed when the erase count value is greater than a predetermined first threshold value.

14. The method according to claim 13, further comprising, before the applying of the erase voltage, performing a second blind program operation on the memory block when the erase count value is greater than a predetermined second threshold value.

15. The method according to claim 13, further comprising performing a second blind program operation on the memory block if the erase verify operation passes, and when the erase count value is greater than a predetermined second threshold value.

16. A semiconductor memory device comprising:
a memory block including a plurality memory cells;
a peripheral circuit configured to perform an erase operation on the memory block; and
a control logic configured to control the peripheral circuit to apply an erase voltage to the memory block, to perform an erase verify operation on the memory block to determine whether threshold voltages of memory cells included in the memory block have reached the erase state, to perform a first blind program operation on the memory block if the erase verify operation fails and to apply a changed erase voltage having a higher voltage than the erase voltage to the memory block after the first blind program operation has been performed.

17. The semiconductor memory device of claim 16,
wherein the control logic is configured to control the peripheral circuit to perform the first blind program operation by simultaneously applying a first blind program voltage to a plurality of word lines coupled to the memory block.

18. The semiconductor memory device of claim 16,
wherein the control logic is configured to control the peripheral circuit to perform a second blind program operation on the memory block before the erase voltage is applied to the memory block.

19. The semiconductor memory device of claim 18,
wherein the control logic is configured to control the peripheral circuit to perform the second blind program operation regardless of whether a program operation has been performed on the memory block.

20. The semiconductor memory device of claim 18,
wherein the second blind program operation is performed on the memory block to increase the threshold voltages of the memory cells.

21. The semiconductor memory device of claim 17,
wherein the control logic is configured to control the peripheral circuit to perform the first blind program operation using a changed first blind program voltage having a different voltage level from the first blind voltage.

* * * * *